United States Patent
Du et al.

(10) Patent No.: US 12,060,633 B2
(45) Date of Patent: Aug. 13, 2024

(54) METHOD AND DEVICE FOR CONTROLLING STRETCHING OF MASK, AND STRETCHING SYSTEM

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Sen Du, Beijing (CN); Jianpeng Wu, Beijing (CN); Yuanqi Zhang, Beijing (CN); Fengli Ji, Beijing (CN); Qian Xu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 483 days.

(21) Appl. No.: 17/007,909

(22) Filed: Aug. 31, 2020

(65) Prior Publication Data
US 2021/0292883 A1    Sep. 23, 2021

(30) Foreign Application Priority Data
Sep. 20, 2019   (CN) .......................... 201910895062.6

(51) Int. Cl.
| | |
|---|---|
| *C23C 14/54* | (2006.01) |
| *C23C 14/04* | (2006.01) |
| *H01L 31/0216* | (2014.01) |
| *H01L 33/58* | (2010.01) |
| *H10K 71/16* | (2023.01) |

(52) U.S. Cl.
CPC ............ *C23C 14/042* (2013.01); *C23C 14/54* (2013.01); *H01L 31/02162* (2013.01); *H01L 33/58* (2013.01); *H10K 71/166* (2023.02)

(58) Field of Classification Search
None
See application file for complete search history.

(56) References Cited

U.S. PATENT DOCUMENTS

| | | | |
|---|---|---|---|
| 2012/0183676 A1* | 7/2012 | Sonoda | H10K 71/166 118/712 |
| 2017/0280072 A1* | 9/2017 | Zhang | G06V 10/267 |

FOREIGN PATENT DOCUMENTS

| | | | | |
|---|---|---|---|---|
| CN | 109504938 A | * | 3/2019 | ........... C23C 14/042 |

\* cited by examiner

*Primary Examiner* — Jose I Hernandez-Kenney
(74) *Attorney, Agent, or Firm* — Procopio, Cory, Hargreaves & Savitch LLP

(57) ABSTRACT

A method for controlling stretching of a mask includes: obtaining actual position information of at least one opening of the mask; determining an actual offset of each opening according to actual position information of the opening and preset position information of a light-emitting region of a sub-pixel corresponding to the opening; determining whether the actual offset of the opening is less than or equal to a theoretical maximum offset of the opening; and in response to determining that the actual offset of the opening is less than or equal to the theoretical maximum offset of the opening, generating a first end command for ending a process of stretching the mask.

12 Claims, 10 Drawing Sheets

METHOD AND DEVICE FOR CONTROLLING STRETCHING OF MASK, AND STRETCHING SYSTEM

CROSS-REFERENCE TO RELATED APPLICATION

This application claims priority to Chinese Patent Application No. 201910895062.6, filed on Sep. 20, 2019, which is incorporated herein by reference in its entirety.

TECHNICAL FIELD

The present disclosure relates to the field of display technologies, and in particular, to a method and a device for controlling stretching of a mask, and a stretching system.

BACKGROUND

Organic light-emitting diode (OLED) display devices have become a mainstream development trend of the display field, due to their advantages such as self-luminescence, light and thin, low energy consumption, wide viewing angle, high brightness and excellent contrast.

In a process of manufacturing an OLED display panel, with the help of a mask, desired pixel patterns are formed on a substrate by vacuum evaporation, so that the display panel including the pixel patterns is obtained. When the pixel patterns are formed on the substrate, an offset of an opening of the mask relative to a light-emitting region of the display panel needs to be within a preset range.

SUMMARY

In one aspect, a method for controlling stretching of a mask is provided. The method includes: obtaining actual position information of at least one opening of the mask; determining an actual offset of each opening according to actual position information of the opening and preset position information of a light-emitting region of a sub-pixel corresponding to the opening; determining whether the actual offset of the opening is less than or equal to a theoretical maximum offset of the opening, the theoretical maximum offset of the opening being determined according to a minimum distance from a border of the light-emitting region to a border of the opening in a case where a geometric center of the light-emitting region coincides with a geometric center of the opening; in response to determining that the actual offset of the opening is less than or equal to the theoretical maximum offset of the opening, generating a first end command for ending a process of stretching the mask.

In some embodiments, the actual position information of the opening includes coordinates of an actual geometric center of the opening, and the preset position information of the light-emitting region includes coordinates of a preset geometric center of the light-emitting region. Determining the actual offset of the opening according to the actual position information of the opening and the preset position information of the light-emitting region of the sub-pixel corresponding to the opening, includes: determining the actual offset of the opening according to the coordinates of the actual geometric center of the opening and the coordinates of the preset geometric center of the light-emitting region.

In some embodiments, the actual position information of the opening includes coordinates of an actual geometric center of the opening. The method further includes: in response to determining that the actual offset of any one of the at least one opening is greater than a theoretical maximum offset of the one of the at least one opening, determining whether an actual geometric center of the one of the at least one opening is within a preset maximum offset region, the preset maximum offset region being a region that allows a maximum offset of the actual geometric center of the one of the at least one opening; in response to determining that the actual geometric center of the one of the at least one opening is within the preset maximum offset region, generating a second end command for ending the process of stretching the mask; in response to determining that the actual geometric center of the one of the at least one opening is not within the preset maximum offset region, generating an adjustment command for starting a parameter adjustment process for adjusting the stretching of the mask.

In some embodiments, the preset position information of the light-emitting region includes coordinates of a preset geometric center of the light-emitting region. Determining whether the actual geometric center of the one of the at least one opening is within the preset maximum offset region, includes: determining an offset function $F(X_m)$ of the actual geometric center of the one of the at least one opening according to coordinates of the actual geometric center of the one of the at least one opening and coordinates of a preset geometric center of a corresponding light-emitting region, wherein an absolute value of $X_m$ is greater than an absolute value of $X_0$, and is less than an absolute value of $X_1$, one of $X_0$ and $X_1$ is an abscissa of the preset geometric center of the corresponding light-emitting region, and another is an abscissa of the actual geometric center of the one of the at least one opening; determining whether the offset function $F(X_m)$ of the actual geometric center of the one of the at least one opening and a boundary function $G(X_n)$ of the preset maximum offset region have a common solution $(X, Y)$; in response to determining that the offset function $F(X_m)$ and the boundary function $G(X_n)$ have the common solution $(X, Y)$, determining whether the X in the common solution is equal to one of $X_0$ and $X_1$: in response to determining that the X in the common solution is equal to one of $X_0$ and $X_1$, determining that the actual geometric center of the one of the at least one opening is within the preset maximum offset region; and in response to determining that the X in the common solution is not equal to one of $X_0$ and $X_1$, determining that the actual geometric center of the one of the at least one opening is not within the preset maximum offset region; and in response to determining that the offset function $F(X_m)$ and the boundary function $G(X_n)$ do not have the common solution, determining that the actual geometric center of the one of the at least one opening is within the preset maximum offset region.

In some embodiments, an expression of the offset function $F(X_m)$ of the actual geometric center of the one of the at least one opening is:

$$F(X_m) = \frac{Y_1 - Y_0}{X_1 - X_0} X_m + \left(Y_1 - \frac{Y_1 - Y_0}{X_1 - X_0} X_1\right);$$

wherein $X_m$ is an abscissa independent variable of the offset function of the actual geometric center of the one of the at least one opening, $X_0$ is the abscissa of the preset geometric center of the corresponding light-emitting region, $Y_0$ is an ordinate of the preset geometric center of the corresponding light-emitting region, $X_1$ is the abscissa of the actual geometric center of the one of the at least one opening, and $Y_1$ is an ordinate of the actual geometric center of the one of the at least one opening. An expression of the boundary function $G(X_n)$ of the preset maximum offset region is: $G(X_n)=AX_n^2+BX_n+C$; wherein A is a first constant, B is a second constant, C is a third constant, $X_n$ is an abscissa independent variable of the boundary function of the preset maximum offset region.

In some embodiments, before determining whether the actual geometric center of the one of the at least one opening is within the preset maximum offset region, the method further includes: receiving first theoretical position information of at least one reference opening of a reference mask, width information of a first shadow corresponding to each reference opening, and a geometric center of a light-emitting region of a sub-pixel in a display panel directly opposite to the reference opening based on the display panel manufactured using the reference mask, the reference mask and the mask having a same specification; and determining the boundary function $G(X_n)$ of the preset maximum offset region corresponding to the opening by a fitting method according to first theoretical position information of a corresponding reference opening, width information of a corresponding first shadow, and a geometric center of a corresponding light-emitting region.

In some embodiments, before determining whether the actual geometric center of the one of the at least one opening is within the preset maximum offset region, the method further includes: receiving second theoretical position information of the at least one opening of the mask, width information of a second shadow corresponding to each opening, and a geometric center of a light-emitting region of a sub-pixel in a display panel corresponding to the opening based on a simulation method; and determining the boundary function $G(X_n)$ of the preset maximum offset region corresponding to the opening by a fitting method according to second theoretical position information of the opening, width information of a corresponding second shadow, and a geometric center of a corresponding light-emitting region.

In another aspect, a device for controlling stretching of a mask is provided. The device includes a memory and a processor. The memory is configured to store executable program codes. The processor is configured to execute the program codes to: obtain actual position information of at least one opening of the mask; determine an actual offset of each opening according to actual position information of the opening and preset position information of a light-emitting region of a sub-pixel corresponding to the opening; determine whether the actual offset of the opening is less than or equal to a theoretical maximum offset of the opening, the theoretical maximum offset of the opening being determined according to a minimum distance from a border of the light-emitting region to a border of the opening in a case where a geometric center of the light-emitting region coincides with a geometric center of the opening; and in response to determining that the actual offset of the opening is less than or equal to the theoretical maximum offset of the opening, generate a first end command for ending a process of stretching the mask.

In some embodiments, the actual position information of the opening includes coordinates of an actual geometric center of the opening, and the preset position information of the light-emitting region includes coordinates of a preset geometric center of the light-emitting region. The processor is further configured to execute the program codes to determine the actual offset of the opening according to the coordinates of the actual geometric center of the opening and the coordinates of the preset geometric center of the light-emitting region.

In some embodiments, the actual position information of the opening includes coordinates of an actual geometric center of the opening. The processor is further configured to execute the program codes to: in response to determining that the actual offset of any one of the at least one opening is greater than a theoretical maximum offset of the one of the at least one opening, determine whether an actual geometric center of the one of the at least one opening is within a preset maximum offset region, the preset maximum offset region being a region that allows a maximum offset of the actual geometric center of the one of the at least one opening; in response to determining that the actual geometric center of the one of the at least one opening is within the preset maximum offset region, generate a second end command for ending the process of stretching the mask; and in response to determining that the actual geometric center of the one of the at least one opening is not within the preset maximum offset region, generate an adjustment command for starting a parameter adjustment process for adjusting the stretching of the mask.

In some embodiments, the preset position information of the light-emitting region includes coordinates of a preset geometric center of the light-emitting region. The processor is further configured to execute the program codes to: determine an offset function $F(X_m)$ of the actual geometric center of the one of the at least one opening according to coordinates of the actual geometric center of the one of the at least one opening and coordinates of a preset geometric center of a corresponding light-emitting region, wherein an absolute value of $X_m$ is greater than an absolute value of $X_0$, and is less than an absolute value of $X_1$, one of $X_0$ and $X_1$ is an abscissa of the preset geometric center of the corresponding light-emitting region, and another is an abscissa of the actual geometric center of the one of the at least one opening; determine whether the offset function $F(X_m)$ of the actual geometric center of the one of the at least one opening and a boundary function $G(X_n)$ of the preset maximum offset region have a common solution (X, Y); in response to determining that the offset function $F(X_m)$ and the boundary function $G(X_n)$ have the common solution (X, Y), determine whether the X in the common solution is equal to one of $X_0$ and $X_1$; in response to determining that the X in the common solution is equal to one of $X_0$ and $X_1$, determine that the actual geometric center of the one of the at least one opening is within the preset maximum offset region; and in response to determining that the X in the common solution is not equal to one of $X_0$ and $X_1$, determine that the actual geometric center of the one of the at least one opening is not within the preset maximum offset region; and in response to determining that the offset function $F(X_m)$ and the boundary function $G(X_n)$ do not have the common solution, determine that the actual geometric center of the one of the at least one opening is within the preset maximum offset region.

In some embodiments, an expression of the offset function $F(X_m)$ of the actual geometric center of the one of the at least one opening is:

$$F(X_m) = \frac{Y_1 - Y_0}{X_1 - X_0} X_m + \left(Y_1 - \frac{Y_1 - Y_0}{X_1 - X_0} X_1\right);$$

wherein $X_m$ is an abscissa independent variable of the offset function of the actual geometric center of the one of the at least one opening, $X_0$ is the abscissa of the preset geometric center of the corresponding light-emitting region, $Y_0$ is an ordinate of the preset geometric center of the corresponding light-emitting region, $X_1$ is the abscissa of the actual geometric center of the one of the at least one opening, and $Y_1$ is an ordinate of the actual geometric center of the one of the at least one opening. An expression of the boundary function $G(X_n)$ of the preset maximum offset region is: $G(X_n) = AX_n^2 + BX_n + C$; wherein A is a first constant, B is a second constant, C is a third constant, $X_n$ is an abscissa independent variable of the boundary function of the preset maximum offset region.

In some embodiments, the device further includes a transceiver. The transceiver is configured to receive first theoretical position information of at least one reference opening of a reference mask, width information of a first shadow corresponding to each opening, and a geometric center of a light-emitting region of a sub-pixel in a display panel directly opposite to the reference opening based on the display panel manufactured using the reference mask, the reference mask and the mask having a same specification. And the processor is further configured to execute the program codes to determine the boundary function $G(X_n)$ of the preset maximum offset region corresponding to the opening by a fitting method according to first theoretical position information of a corresponding reference opening, width information of a corresponding first shadow, and a geometric center of a corresponding light-emitting region.

In some embodiments, the device further includes a transceiver. The transceiver is configured to receive second theoretical position information of the at least one opening of the mask, width information of a second shadow corresponding to each opening, and a geometric center of a light-emitting region of a sub-pixel in a display panel corresponding to the opening based on a simulation method. And the processor is further configured to execute the program codes to determine the boundary function $G(X_n)$ of the preset maximum offset region corresponding to the opening by a fitting method according to second theoretical position information of the opening, width information of a corresponding second shadow, and a geometric center of a corresponding light-emitting region.

In some embodiments, the memory is further configured to store the preset position information of the light-emitting region, the actual position information of the opening, and the first theoretical location information of the reference opening.

In yet another aspect, a non-transitory computer-readable storage medium is provided. The storage medium stores one or more program instructions that, when are executed by one or more processors of a control device, cause the one or more processors to perform one or more steps of the above method for controlling the stretching of the mask.

In yet another aspect, a stretching system is provided. The stretching system includes the above device for controlling the stretching of the mask.

In some embodiments, the stretching system further includes a stretcher. The transceiver in the device is communicatively coupled to the stretcher.

BRIEF DESCRIPTION OF THE DRAWINGS

In order to describe technical solutions in the present disclosure more clearly, accompanying drawings to be used in some embodiments of the present disclosure will be introduced below briefly. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals that the embodiments of the present disclosure relate to.

DETAILED DESCRIPTION

The technical solutions in some embodiments of the present disclosure will be described clearly and completely with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof, such as the third-person singular form "comprises" and the present participle form "comprising" in the description and the claims are construed as open and inclusive, i.e., "inclusive, but not limited to". In the description, terms such as "one embodiment", "some embodiments", "exemplary embodiments", "example", "specific example", or "some examples", are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

The terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, term "a plurality of/the plurality of" means two or more unless otherwise specified.

The terms "connected" and "coupled" may indicate that two or more elements are in direct physical or electrical contact with each other. The term "coupled", "connected" or "communicatively coupled", however, may also mean that two or more elements are not in direct contact with each other, but yet still cooperate or interact with each other. The embodiments disclosed herein are not necessarily limited in this context.

In addition, the use of "based on" means an open and inclusive language, as the process, steps, calculation or other actions of being "based on" one or more of conditions or values may be based on additional conditions or exceeding the values in practice.

Figure 1:
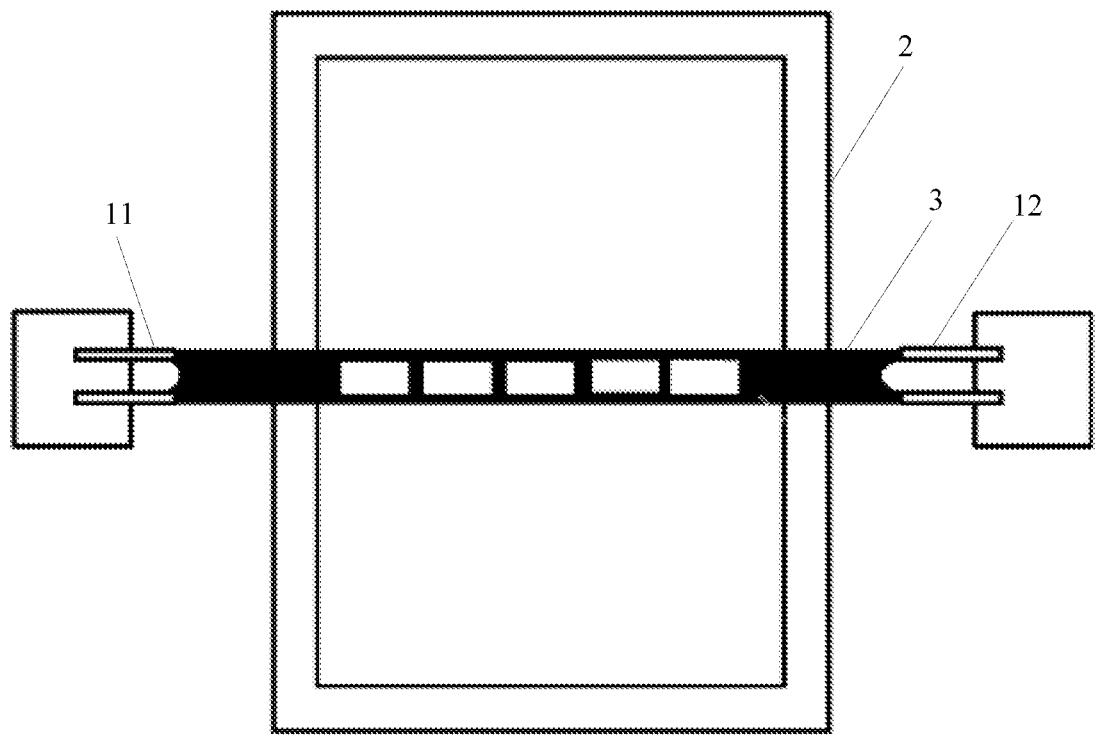
FIG. 1 is a schematic diagram of a stretching system, in accordance with some embodiments.

In a process of manufacturing an organic light-emitting diode (OLED) display panel, a mask assembly is used in an evaporation process to form layers on a substrate. As shown in FIG. 1, the mask assembly includes a frame 2 playing a supporting role, and one or more masks 3, such as fine metal masks (FMMs) each with precise patterns. The masks 3 are stretched and fixed on the frame 2.

For example, a material of the frame 2 is a metal material. The material of the frame 2 can also be selected according to actual needs, as long as it can meet strength requirements for supporting the masks 3 and high temperature resistance requirements in the evaporation process.

Figure 2:
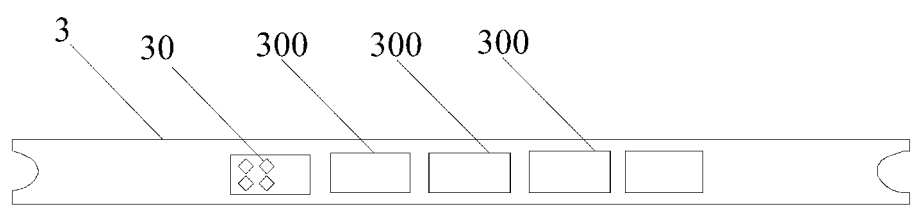
FIG. 2 is a schematic diagram showing a structure of a mask, in accordance with some embodiments.
Figure 3A:
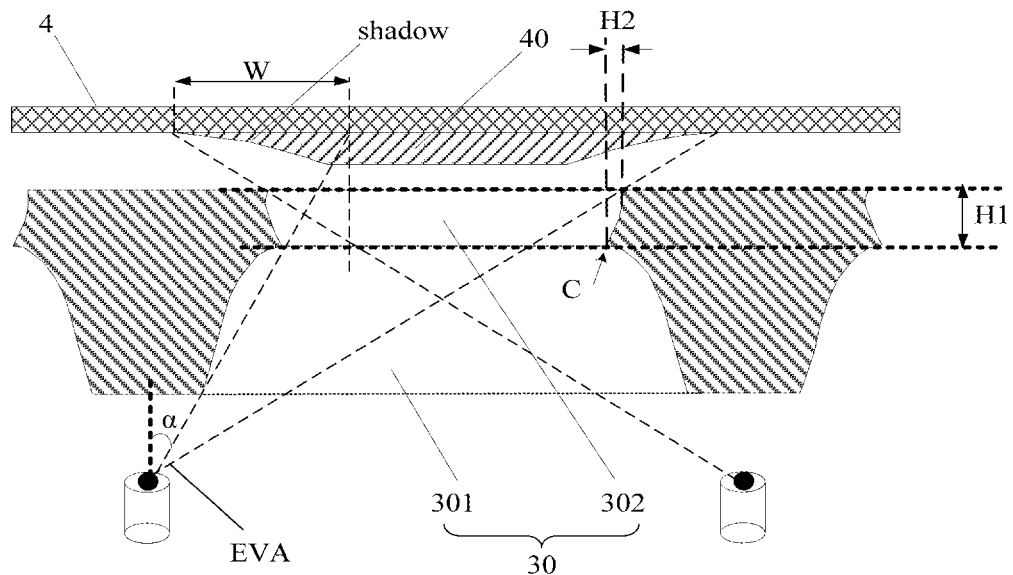
FIG. 3A is a diagram of a correspondence between an opening of a mask and a pixel region of a display panel.

For example, as shown in FIGS. 2 and 3A, the mask 3 includes at least one patterned region 300, and the patterned region 300 corresponds to a display panel. The patterned region 300 has a plurality of openings 30, and each opening 30 corresponds to a pixel region 40 in the display panel.

As shown in FIG. 3A, a pixel pattern is formed in a pixel region 40 on the substrate 4 through the opening 30. The substrate 4 refers to a substrate of the display panel on which a plurality of layers may be formed.

Figure 10:
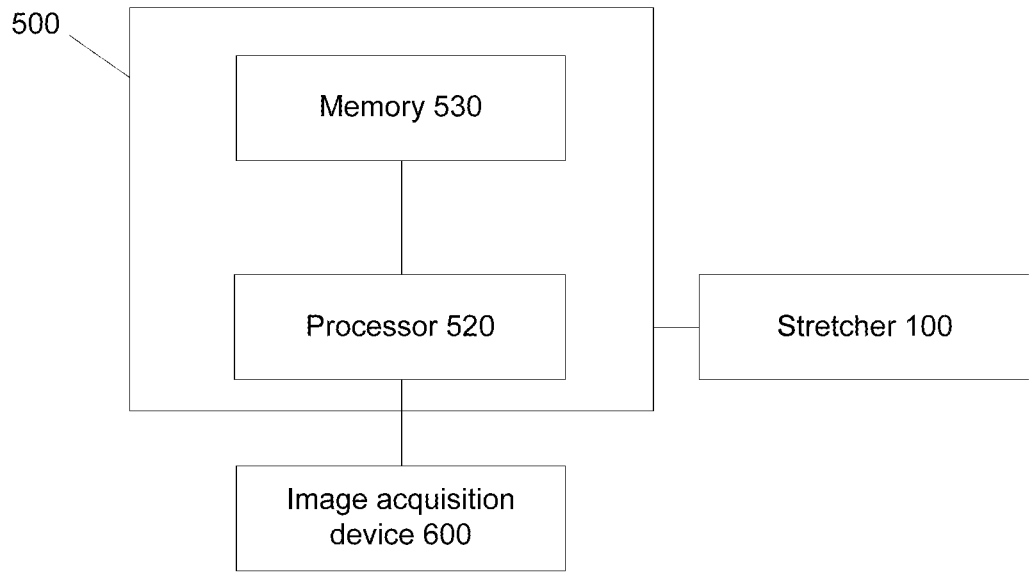
FIG. 10 is a block diagram of a stretching system, in accordance with some embodiments.

Before the masks 3 are fixed on the frame 2, the masks 3 may be stretched by a stretching system. FIG. 10 is a block diagram of a stretching system according to some embodiments. As shown in FIGS. 1 and 10, the stretching system includes a device for controlling stretching of a mask (hereinafter referred to as a control device) 500. The stretching system may further include at least one of a stretcher 100 (including a first jaw 11 and a second jaw 12) and an image acquiring device 600. The control device 500 is communicatively coupled to the stretcher 100. The control device 500 may be embedded inside the stretcher 100.

A process for stretching the mask 3 will be described below with reference to FIGS. 1 to 5. It will be understood that, the following description is only used to explain the process for stretching the mask 3, and does not constitute a limitation on a shape of the opening 30 of the mask 3.

In a first step, the frame 2 is placed on a stage of the stretcher 100.

In a second step, as shown in FIG. 1, the first jaw 11 of the stretcher 100 is controlled to clamp a first end of the mask 3, and the second jaw 12 of the stretcher 100 is controlled to clamp an opposite end of the mask 3.

In a third step, the control device 500 controls the first jaw 11 and the second jaw 12 to move the mask 3 onto the frame 2, and to apply a pulling force to the mask 3, so that the mask 3 is gradually stretched.

In a fourth step, the image acquiring device 600, such as a charge coupled device (CCD) image sensor or a complementary metal oxide semiconductor (CMOS) image sensor, captures alignment holes of the mask 3, and the control device 500 controls the first jaw 11 and the second jaw 12 to preliminarily adjust a position of the mask 3 relative to the frame 2, so that the alignment holes of the mask 3 substantially coincide with alignment marks on the frame 2.

In a fifth step, the control device 500 obtains coordinates of actual geometric centers of several openings 30 of the mask 3 by means of the image acquiring device 600, and compares the coordinates of the actual geometric center of each opening 30 and coordinates of a preset geometric center of a corresponding light-emitting region 40Y to obtain an offset of the actual geometric center of the opening 30 relative to the preset geometric center of the light-emitting region 40Y.

Here, the light-emitting region 40Y is a predetermined region for light emission in the display panel. The light-emitting region 40Y is located in the pixel region 40, and has an area less than or equal to an area of the pixel region 40. In an actual evaporation process, it should be ensured that the pixel pattern evaporated to the pixel region 40 completely covers a region where the light-emitting region 40Y is located. That is, the light-emitting region 40Y is provided with the pixel pattern.

In addition, the offset of the actual geometric center of the opening 30 relative to the preset geometric center of the light-emitting region 40Y includes an offset PPAx along a first direction X and an offset PPAy along a second direction Y perpendicular to the first direction. The offset PPAx along the first direction X is the offset PPAx of an abscissa of the actual geometric center of the opening 30 relative to an abscissa of the preset geometric center of the light-emitting region 40Y. The offset PPAy along the second direction Y is the offset PPAy of an ordinate of the actual geometric center of the opening 30 relative to an ordinate of the preset geometric center of the light-emitting region 40Y. It will be noted that the offset of the actual geometric center of the opening 30 relative to the preset geometric center of the light-emitting region 40Y does not include an offset PPAz along a third direction perpendicular to the plane defined by the first direction X and the second direction Y. That is, the opening 30 and the light-emitting region 40Y are considered to be in a same plane when their relative position is considered.

It will be understood that, the coordinates of the actual geometric center of the opening 30 and the coordinates of the preset geometric center of the light-emitting region 40Y are characterized based on a same coordinate system. In addition, all coordinates in the embodiments of the present disclosure are characterized based on the same coordinate system.

Figure 4:
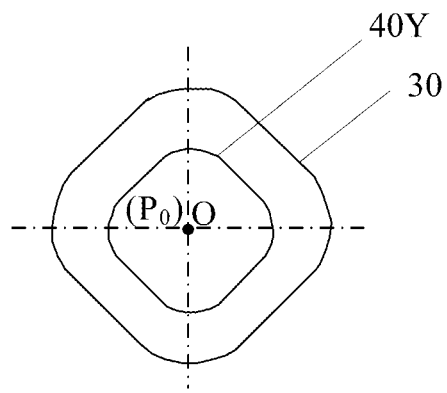
FIG. 4 is a diagram of a correspondence between an opening of a mask and a light-emitting region.

FIG. 4 shows a diagram of a correspondence between the opening 30 of the mask 3 and the light-emitting region 40Y in an ideal state. It can be seen from FIG. 4 that a theoretical geometric center $P_O$ of the opening 30 coincides with the preset geometric center O of the light-emitting region 40Y. That is, the theoretical geometric center $P_O$ of the opening 30 does not have any offset relative to the preset geometric center O of the light-emitting region 40Y.

Figure 5:
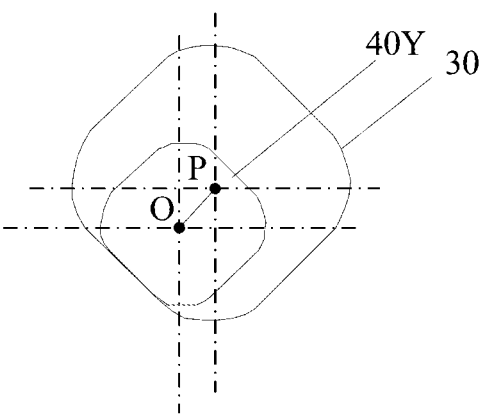
FIG. 5 is a diagram of another correspondence between an opening of a mask and a light-emitting region.

FIG. 5 shows a diagram of a correspondence between the opening 30 of the mask 3 and the light-emitting region 40Y in an offset state. It can be seen from FIG. 5 that the actual geometric center P of the opening 30 shifts from the preset geometric center O of the light-emitting region 40Y. That is, the offset of the actual geometric center P of the opening 30 relative to the preset geometric center O of the light-emitting region 40Y is a length of a segment between O and P.

In a sixth step, the control device 500 determines whether the offset of the actual geometric center P of the opening 30 relative to the preset geometric center O of the light-emitting region 40Y is within a preset range.

In the sixth step, offsets of the actual geometric centers of several openings 30 may be obtained, and it is considered that the offsets of the actual geometric centers of the openings 30 are not within respective preset ranges as long as an offset of an actual geometric center of one opening 30 is not within its preset range.

It will be understood that the smaller the offset of the actual geometric center P of the opening 30 relative to the preset geometric center O of the light-emitting region 40Y is, the higher the pixel position accuracy is, and the larger the offset of the actual geometric center P of the opening 30 relative to the preset geometric center O of the light-emitting region 40Y is, the lower the pixel position accuracy is.

If the offset of the actual geometric center P of the opening 30 relative to the preset geometric center O of the light-emitting region 40Y is within the preset range, it is determined that an actual position of the opening 30 and a theoretical position of the opening 30 are consistent, and a seventh step is performed. Otherwise, it is determined that the actual position of the opening 30 and the theoretical position of the opening 30 are not consistent, and an eighth step is performed.

In the seventh step, the mask 3 is fixed onto the frame 2, and then the first jaw 11 and the second jaw 12 are removed.

For example, the mask 3 is fixed on the frame 2 by welding, or the like. A welding equipment used in a welding process includes, but is not limited to, a welding gun.

In the eighth step, the control device 500 controls the first jaw 11 and the second jaw 12 to adjust the pulling force applied to the mask 3, and then the fifth step is performed again until the offset of the actual geometric center P of the opening 30 relative to the preset geometric center O of the light-emitting region 40Y is within the preset range.

Since the offsets of the actual geometric centers of several openings 30 are obtained, the pulling force applied to the mask 3 is adjusted according to an intermediate offset of the above offsets. The intermediate offset is an offset nearest to the average value of the above offsets.

It will be understood that if more masks 3 are to be fixed on the frame 2, the second to eighth steps of the process are repeated.

In the related art, in order to determine whether the offset of the actual geometric center P of the opening 30 relative to the preset geometric center O of the light-emitting region 40Y is within the preset range, it is required to determine whether the offset PPAx along the first direction X is within a first preset range, and whether the offset PPAy along the second direction Y is within a second preset range. That is, the offsets of the actual geometric center P of the opening 30 relative to the preset geometric center O of the light-emitting region 40Y in the first direction X and in the second direction Y are respectively measured and determined, and then they are adjusted individually. In this case, a color missing and a color mixing may occur in the pixel pattern of the pixel region.

The reason why the color missing and the color mixing may occur in the pixel pattern when the PPAx and the PPAy are individually adjusted is described below by taking a pixel array arranged in a pentile manner as an example. The color missing refers to a missing of the pixel pattern actually evaporated based on the opening 30 relative to the light-emitting region 40Y. The color mixing refers to an overlap of the pixel pattern of a color actually evaporated based on the opening 30 and an adjacent pixel pattern of another color.

It is assumed that the first preset range and the second preset range are both −5 μm to +5 μm. Theoretically, if the offset PPAx along the first direction X and the offset PPAy along the second direction Y are both controlled within ±5 um, the pixel position accuracy is considered to meet requirements.

Figure 6:
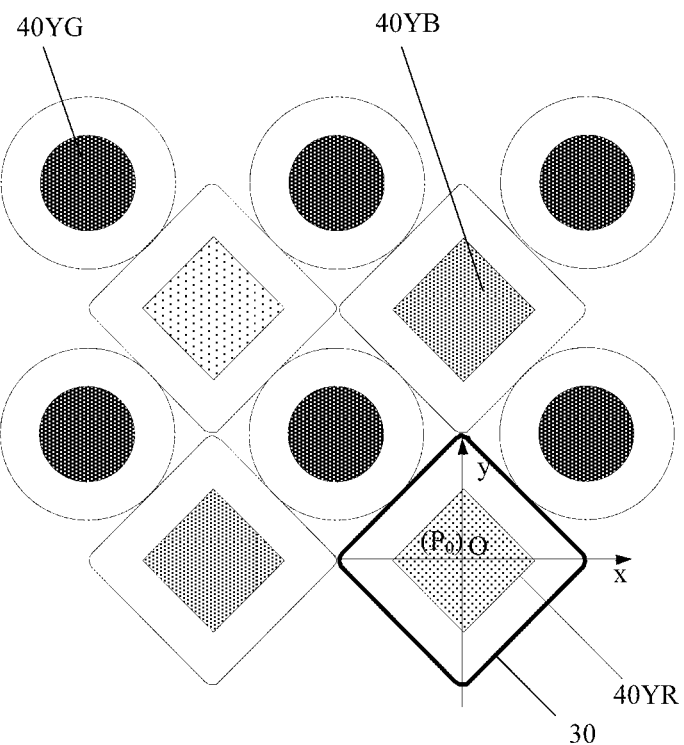
FIG. 6 is a schematic diagram of a relative position of an opening at a theoretical position and a light-emitting region, in accordance with some embodiments.

FIG. 6 shows a schematic diagram of a relative position of the opening 30 at the theoretical position and a light-emitting region 40Y in the pentile arrangement. The light-emitting region 40Y may be a red light-emitting region 40YR, a blue light-emitting region 40YB, or a green light-emitting region 40YG. For example, in the pentile arrangement, both the red light-emitting region 40YR and the blue light-emitting region 40YB are square regions, and the green light-emitting region 40YG is a rounded region.

The preset geometric center O of the red light-emitting region 40YR is taken as an origin, and two lines where two diagonal lines of this red light-emitting region 40YR are located are taken as a horizontal axis x and a vertical axis y, respectively, and a pixel position accuracy coordinate system (i.e., an xOy coordinate system) is established. Both the abscissa and the ordinate are in units of μm. In the xOy coordinate system shown in FIG. 6, the coordinates of the preset geometric center O of this red light-emitting region 40YR is (0, 0).

In a case where the opening 30 does not have any offset relative to the light-emitting region 40Y, as shown in FIG. 6, the preset geometric center O of the red light-emitting region 40YR coincides with the theoretical geometric center $P_O$ of the opening 30.

Figure 7:
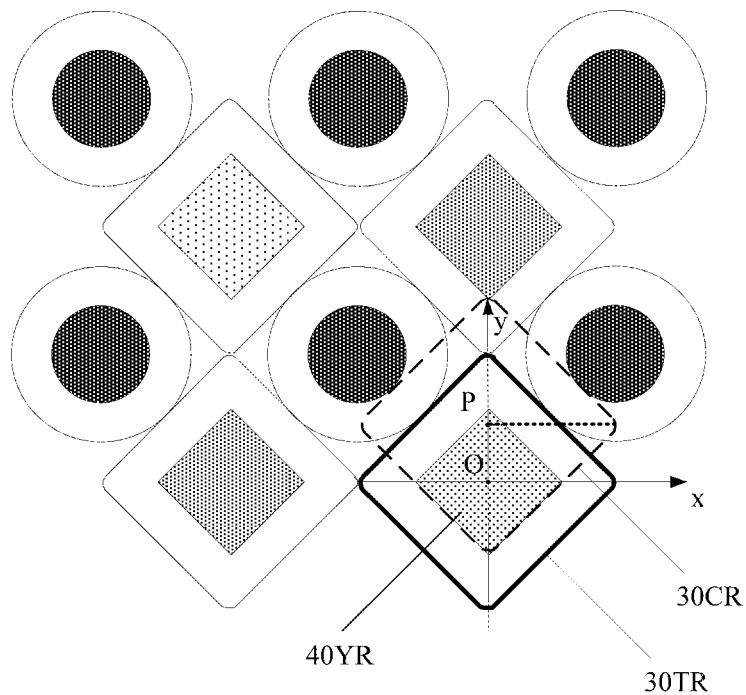
FIG. 7 is a schematic diagram of a relative position of an opening at an actual position and a light-emitting region.
Figure 8:
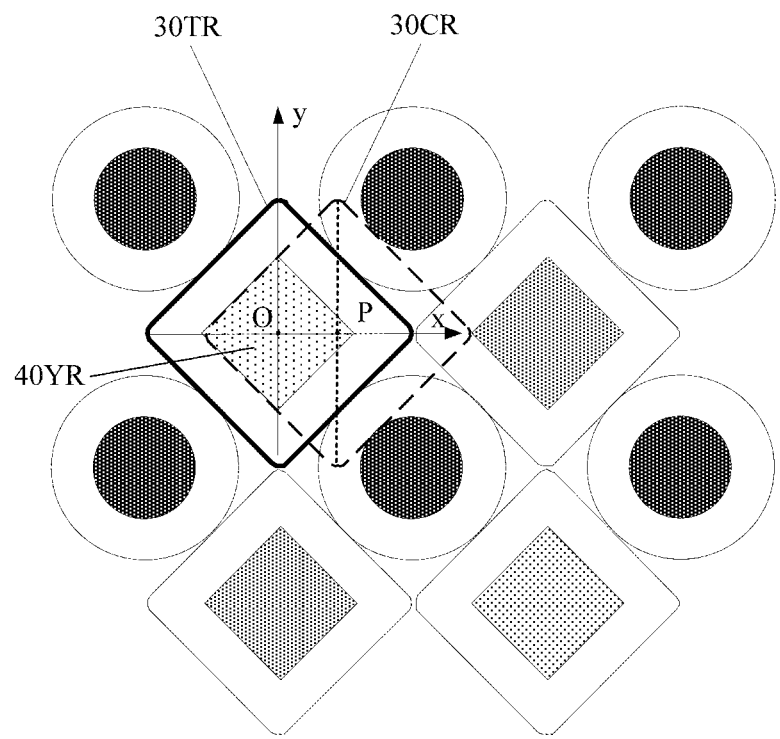
FIG. 8 is a schematic diagram of a relative position of the opening at another actual position and the light-emitting region.
Figure 9:
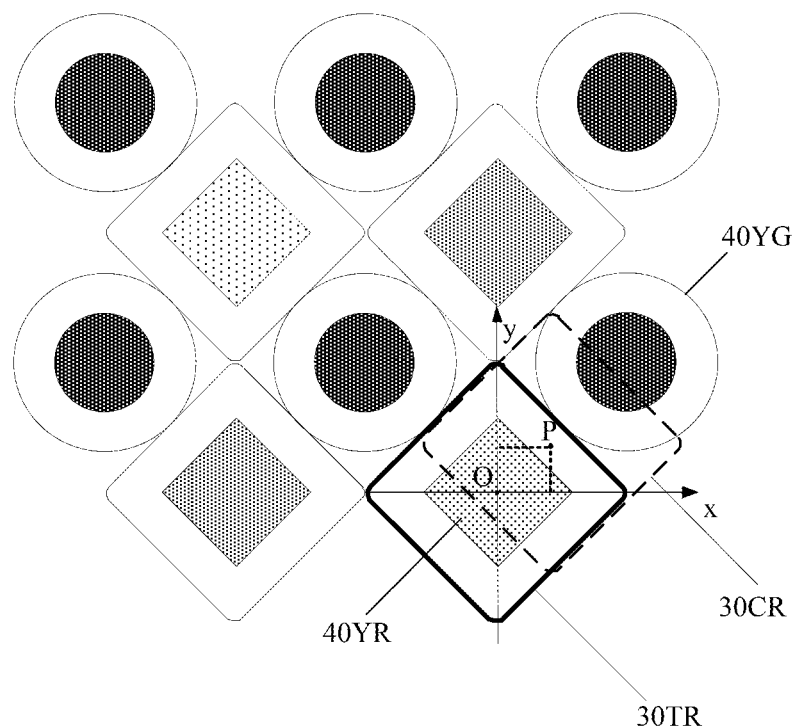
FIG. 9 is a schematic diagram of a relative position of the opening at yet another actual position and a light-emitting region.

Each of FIGS. 7 to 9 shows a schematic diagram of a relative position of the opening 30 at an actual position and the light-emitting region 40Y in the pentile arrangement. The xOy coordinate systems in FIGS. 7 to 9 are the same as the xOy coordinate system in FIG. 6.

In a case where the opening 30 has an offset relative to the light-emitting region 40Y, as shown in FIGS. 7 to 9, the opening 30 shifts from a solid box position 30TR to a dotted box position 30CR.

It can be seen from FIGS. 6 and 7 that the geometric center of the opening 30 corresponding to the red light-emitting region 40YR shifts from the theoretical geometric center $P_O$ (coincident with O) to the actual geometric center P along the vertical axis y. For example, the actual geometric center P of the opening 30 shifts by 4.68 μm along a positive direction of the vertical axis y relative to the theoretical geometric center $P_0$, and the coordinates of the actual geometric center P of the opening 30 is (0, 4.68). In the case, an offset along the vertical axis y (i.e., the PPAy) is within the second preset range of −5 µm to +5 µm. Therefore, it is considered that the actually evaporated red pixel pattern corresponding to the opening 30 may not have a problem of the color mixing or the color missing.

It can be seen from FIGS. 6 and 8 that the geometric center of the opening 30 corresponding to the red light-emitting region 40YR shifts from the theoretical geometric center $P_0$ (coincident with O) to the actual geometric center P along the horizontal axis x. For example, the actual geometric center P of the opening 30 shifts by 4.68 µm along a positive direction of the horizontal axis x relative to the theoretical geometric center $P_0$, and the coordinates of the actual geometric center P of the opening 30 is (4.68, 0). In the case, an offset along the horizontal axis x (i.e., the PPAx) is within the first preset range of −5 µm to +5 µm. Therefore, it is considered that the actually evaporated red pixel pattern corresponding to the opening 30 may not have the problem of the color mixing and the color missing.

It can be seen from FIGS. 6 and 9 that the geometric center of the opening 30 corresponding to the red light-emitting region 40YR shifts from the theoretical geometric center $P_0$ (coincident with O) to the actual geometric center P. For example, the actual geometric center P of the opening 30 shifts by 4 µm along the positive direction of the horizontal axis x and by 3.9 µm along the positive direction of the vertical axis y, and the coordinates of the actual geometric center P of the opening 30 is (4, 3.9). In this case, although the offset along the vertical axis y (i.e., the PPAy) is within the second preset range of −5 µm to +5 µm, and the offset along the horizontal axis x (i.e., the PPAx) is within the first preset range of −5 µm to +5 µm, as shown in FIG. 9, the square opening 30 corresponding to the red light-emitting region 40YR overlaps with a rounded opening 30 corresponding to an adjacent green light-emitting region 40YG, and a region of the opening 30 corresponding to the red light-emitting region 40YR does not overlap with the red light-emitting region 40YR. Therefore, the color mixing is easy to occur between the actually evaporated red pixel pattern corresponding to the shifted opening 30 and the adjacent green pixel pattern. In addition, the problem of the color missing for the red pixel pattern itself may also occur.

It can be seen that the method of adjusting the PPAx and the PPAy separately may not completely ensure that the color mixing and the color missing will not occur in the formed pixel pattern.

Figure 11:
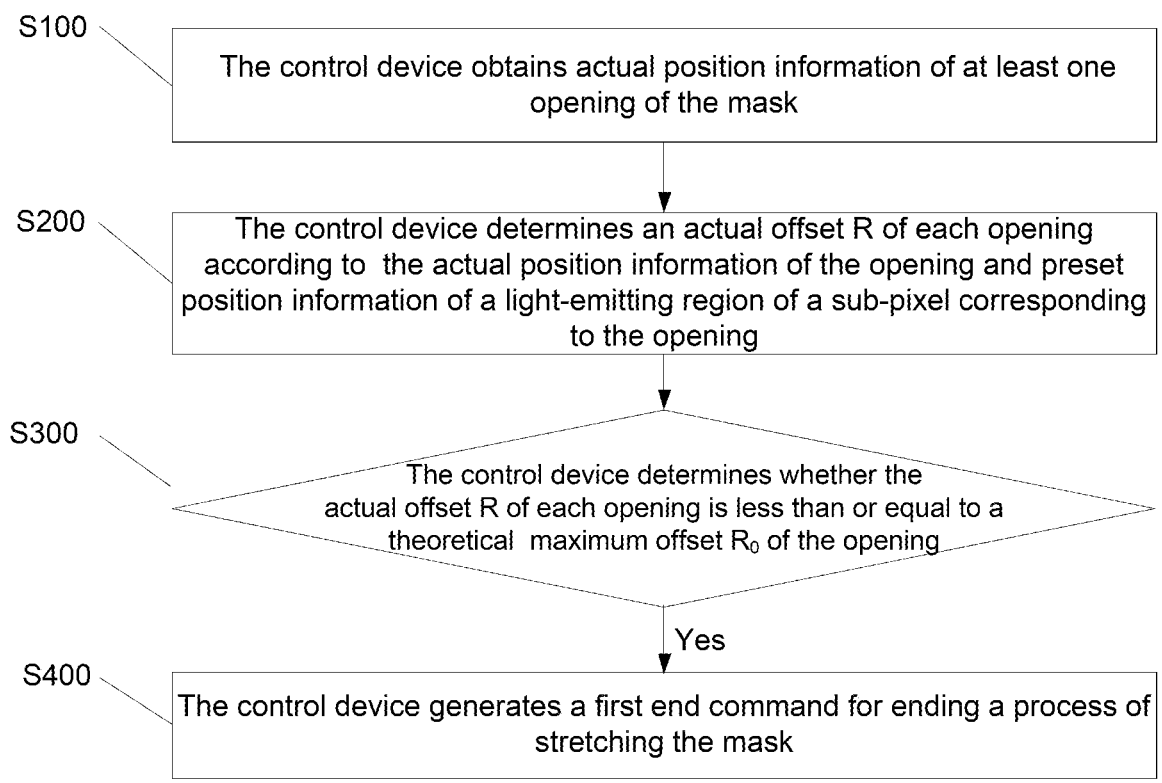
FIG. 11 is a flow chart of a method for controlling stretching of a mask, in accordance with some embodiments.

With regard to the above problems, some embodiments of the present disclosure provide a method for controlling stretching of the mask, which can be performed by the control device 500. As shown in FIG. 11, the method includes S100 to S400.

In S100, the control device 500 obtains actual position information of at least one opening 30 of the mask 3.

The actual position information of an opening 30 refers to information about the position of the opening 30 that is actually measured. In some examples, actual position information of one opening 30 of the mask 3 is obtained. In other examples, actual position information of a plurality of openings 30 of the mask 3 is obtained.

The control device 500 may obtain the actual position information of the opening 30 by processing image information that is collected by the CCD image sensor or the CMOS image sensor. For example, a light source of the stretcher 100 and the CCD image sensor are placed on opposite sides of the mask 3, respectively. The light source is turned on to emit light, which is then incident on the mask 3. The openings 30 of the mask 3 allow the light to pass through, and the remaining portion of the mask 3 reflects the light. In this way, the CCD image sensor may capture binary patterns. Then, the control device 500 determines outline information of the openings 30 according to the binary patterns, and determines the actual position information of the openings 30 according to the outline information.

In S200, the control device 500 determines an actual offset R of each opening 30 according to the actual position information of the opening 30 and preset position information of a light-emitting region of a sub-pixel corresponding to the opening 30.

In a case where actual position information of an opening 30 is obtained, the actual offset R of the opening 30 is determined according to the actual position information of the opening 30. In a case where actual position information of a plurality of openings 30 are obtained, the control device 500 determines the actual offset R of each opening 30. In this case, the actual offsets R of the plurality of opening 30 are determined.

The preset position information of the light-emitting region of the sub-pixel refers to information about the position of a pre-designed light-emitting region for the sub-pixel. In an actual evaporation process, the pixel pattern actually evaporated completely covers the light-emitting region, thereby ensuring the display quality.

The actual offset R of the opening 30 refers to an offset of an actual position of the opening 30 relative to its theoretical position determined based on the light-emitting region. For example, as shown in FIG. 9, the actual offset R of the opening 30 is a distance between an actual vertex of the opening 30 (e.g., the upper vertex of the opening 30CR) and a corresponding theoretical vertex of the opening 30 (e.g., the upper vertex of the opening 30TR). For another example, the actual offset R of the opening 30 is a distance between an actual geometric center P of the opening 30 and a preset geometric center O of the light-emitting region 40YR (coinciding with the theoretical geometric center $P_0$ of the opening 30).

In some examples, coordinates of the actual geometric center of the opening 30 is $(X_1, Y_1)$, and coordinates of the preset geometric center of the light-emitting region 40Y is $(X_0, Y_0)$. An expression of the actual offset R of the opening 30 determined according to the actual geometric center of the opening 30 and the preset geometric center of the light-emitting region 40Y, is:

$$R = \sqrt{(X_1 - X_0)^2 + (Y_1 - Y_0)^2}.$$

It will be understood that the coordinates of the actual geometric center of the opening 30 and the coordinates of the preset geometric center of the light-emitting region 40Y are obtained based on a same coordinate system. For example, an orthographic projection of a geometric center of the frame 2 on a surface of the substrate 4 is taken as an origin, and a coordinate system is established on the surface of the substrate. In this case, both the coordinates of the actual geometric center of the opening 30 and the coordinates of the preset geometric center of the light-emitting region 40Y are determined based on the coordinate system. For another example, a geometric center of a pixel region on the substrate 4 is taken as an origin, and a coordinate system is established on the surface of the substrate 4. In this case, both the coordinates of the actual geometric center of the opening 30 and the coordinates of the preset geometric center of the light-emitting region 40Y are determined based on the coordinate system.

In some examples, the preset position information of the light-emitting region may be pre-stored in a storage medium (for example, a random access memory (RAM), a non-volatile memory) coupled to or included in the control device 500, and the control device 500 may retrieve the preset position information from the storage medium. In some other examples, a display substrate may be calibrated as a reference substrate, and a position of a pixel region of the reference substrate is the preset position of the light-emitting region. In this case, the preset location information of the light-emitting region may be collected by the image acquiring device such as the CCD image sensor or the CMOS image sensor, and then sent to the control device 500.

In S300, the control device 500 determines whether the actual offset R of each opening 30 is less than or equal to a theoretical maximum offset $R_0$ of the opening 30.

The theoretical maximum offset $R_0$ of the opening 30 refers to a maximum offset that allows the geometric center of the opening 30 to shift without causing the color mixing or the color missing when a shadow effect in the evaporation process is not considered. The shadow effect refers to a phenomenon in which the evaporation material diffuses out of a pixel region when a pixel pattern corresponding to the pixel region is evaporated. The theoretical maximum offset $R_0$ of the opening 30 is determined according to a minimum distance from a border of the light-emitting region to a border of the opening 30 in a case where the geometric center of the light-emitting region coincides with the geometric center of the opening 30. That is, the theoretical maximum offset $R_0$ of the opening 30 is the minimum distance from a border of the light-emitting region to a border of the opening 30 in a case where the geometric center of the light-emitting region coincides with the geometric center of the opening 30.

For example, as shown in FIG. 6, the light-emitting region is the rounded light-emitting region 40YG, and the theoretical maximum offset $R_0$ of the opening 30 is a difference between a radius of the opening 30 and a radius of the rounded light-emitting region 40YG in a case where the geometric center of the light-emitting region 40YG coincides with the geometric center of the opening 30.

For another example, as shown in FIG. 6, the light-emitting region is the square light-emitting region 40YR, and the theoretical maximum offset $R_0$ of the opening 30 is a minimum distance from any side of the light-emitting region 40YR to a corresponding side of the opening 30 in a case where the geometric center of the light-emitting region 40YR coincides with the geometric center of the opening 30.

For yet another example, the light-emitting region is an arbitrarily shaped light-emitting region, and the theoretical maximum offset $R_0$ of the opening 30 is a minimum distance from a border of the light-emitting region to a border of the opening 30 in a case where the geometric center of the light-emitting region coincides with the geometric center of the opening 30.

In S400, in response to determining that the actual offset R of each opening 30 is less than or equal to the theoretical maximum offset $R_0$ of the opening 30, the control device 500 generates a first end command for ending a process of stretching the mask.

If the actual offset R of the opening 30 is less than or equal to the theoretical maximum offset $R_0$ of the opening 30, the pixel pattern formed based on the opening 30 can completely cover the light-emitting region, and the color mixing thereof with the adjacent pixel region may not occur. Therefore, the current stretching parameters for stretching the mask 3 are appropriate.

The first end command is used to instruct the stretcher 100 to end the process of the stretching the mask 3. In response to receiving the first end command, the stretcher 100 ends the process of stretching the mask 3, and controls the first jaw 11 and the second jaw 12 to keep the mask 3 at the current position. Then, a welding gun is used to fix the mask 3 onto the frame 2.

In the method for controlling the stretching of the mask in some embodiments of the present disclosure, by determining the relationship between the actual offset R of the opening 30 and the theoretical maximum offset $R_0$ of the opening 30, the first end command is generated in response to that the actual offset of the opening 30 is less than or equal to the theoretical maximum offset of the opening 30. Since the determination of the relationship between the actual offset R of the opening 30 and the theoretical maximum offset $R_0$ of the opening 30 is equivalent to determining whether the actual geometric center of the opening 30 is located in a rounded region with a radius of the theoretical maximum offset $R_0$, in the embodiments of the present disclosure, the actual offset R of the opening 30 is obtained by considering the abscissa and the ordinate of the actual geometric center of the opening 30 together, and thus the problem of the color missing or the color mixing that may exist when the abscissa and the ordinate are considered independently may be avoided, thereby improving a product yield.

A person skilled in the art will understand that there are various processes for manufacturing the mask 3, and the process for manufacturing the mask 3 may affect the opening 30 of the mask 3, which may cause different portions of the opening 3 along its border to correspond to different maximum offsets of the geometric center of the opening 30 that are allowed in different directions without causing the color mixing or the color missing when a shadow effect in the evaporation process is not considered. For ease of understanding, it is described below by examples.

Figure 3B:
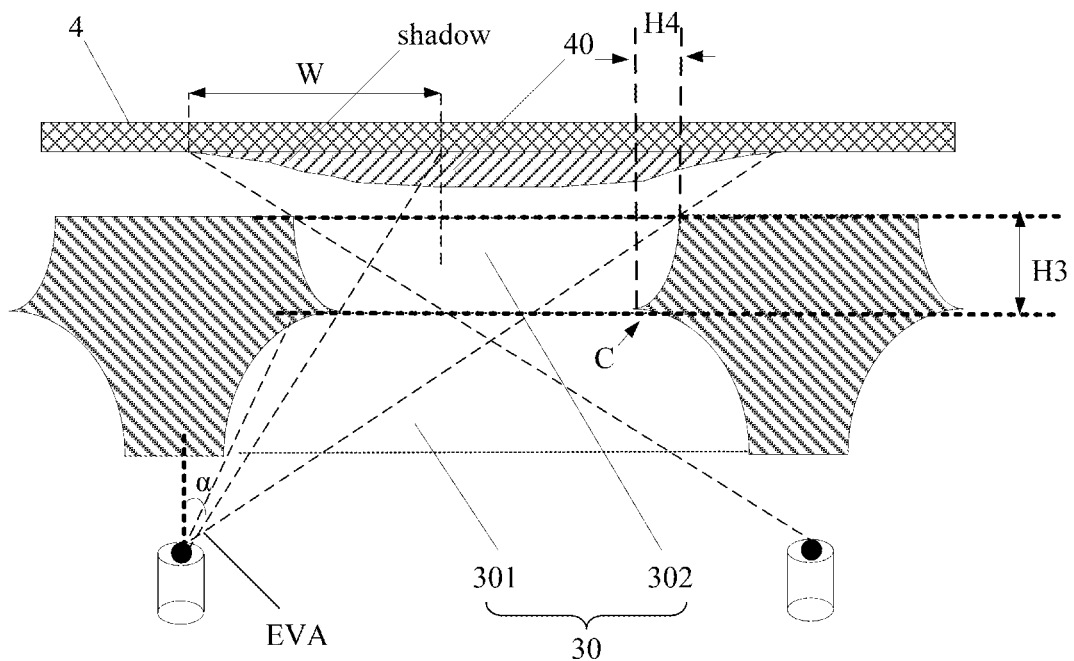
FIG. 3B is a diagram of another correspondence between an opening of a mask and a pixel region of a display panel.

For example, during the process of manufacturing the fine metal mask, a chemical etching method is used to form the opening 30 of the mask 3. During the etching, as shown in FIGS. 3A and 3B, the mask 3 may be etched by a chemical agent from both surfaces thereof, and thus a first opening portion 301 and a second opening portion 302 may be formed along a depth direction of the opening 30. The first opening portion 301 may be farther away from the substrate 4 relative to the second opening portion 302.

Figure 12:
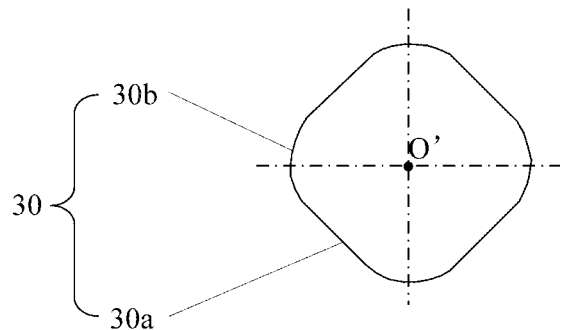
FIG. 12 is a schematic diagram of a square opening, in accordance with some embodiments.

In addition, as shown in FIG. 6, if the pixel patterns to be evaporated are pixel patterns in the pixel array arranged in the pentile manner, the openings 30 formed by the chemical etching may include square openings and rounded openings. As shown in FIG. 12, the square opening 30 has edge geometric features, which include linear geometric features (corresponding to linear geometric feature edges 30a) and rounded corner geometric features (corresponding to rounded corner geometric feature edges 30b). The linear geometric features correspond to four sides of the square opening 30, and the rounded corner geometric features correspond to four corners of the square opening 30. It will be noted that, since the square has four right angles, the edge geometric features corresponding to the four corners of the square opening 30 should be point-like geometric features. However, due to a limitation of the etching process, the edge geometric features corresponding to the four corners of the square opening 30 are presented as the rounded corner geometric features.

FIG. 3A shows a correspondence between a liner geometric feature edge 30a of the opening 30 and a pixel region 40, and FIG. 3B shows a correspondence between a rounded corner geometric feature edge 30b of the opening 30 and a pixel region 40. As shown in FIGS. 3A and 3B, a dimension H1 of a liner geometric feature edge of the second opening portion 302 along the depth direction of the opening 30 may be different from a dimension H3 of a rounded corner geometric feature edge of the second opening portion 302 along the depth direction of the opening 30, and a distance H2 between borders of orthographic projections of two surfaces of the liner geometric feature edge of the second opening portion 302 proximate to and away from the first opening portion 301 on the substrate 4 may also be different from a distance H4 between borders of orthographic projections of two surfaces of the rounded corner geometric feature edge of the second opening portion 302 proximate to and away from the first opening portion 301 on the substrate 4. The depth direction of the opening 30 is perpendicular to a surface of the mask 3.

For example, as shown in FIG. 3A, a dimension H1 of the linear geometric feature edge 30a of the second opening portion 302 along the depth direction of the opening 30 is small, and as shown in FIG. 3B, a dimension H3 of the rounded corner geometric feature edge 30b of the second opening portion 302 along the depth direction of the opening 3 is large. In addition, as shown in FIG. 3A, the distance H2 between borders of the orthographic projections of the two surfaces of the linear geometric feature edge 30a of the second opening portion 302 proximate to and away from the first opening portion 301 on the substrate 4 is small, and as shown in FIG. 3B, the distance H4 between borders of the orthographic projections of the two surfaces of the rounded corner geometric feature edge 30b of the second opening portion 302 proximate to and away from the first opening portion 301 on the substrate 4 is large.

As shown in FIGS. 3A and 6, the edge geometric characteristics of the rounded opening 30 in all directions are the same. Therefore, the edge of the second opening portion 302 of the rounded opening theoretically has a same dimension along the depth direction of the opening. However, considering the stability of the process, the edge geometric characteristics of the rounded opening in all directions have a certain difference, and the dimension of the edge of the second opening portion 302 of the rounded opening along the depth direction of the opening also has a certain difference.

A person skilled in the art will understand that, as shown in FIGS. 3A and 3B, in a case where the pixel pattern in the pixel region 40 is formed on the substrate 4 by the evaporation process, due to a scanning manner of an evaporation source and a linear propagating manner of an evaporation material, a region corresponding to the pixel pattern located outside the orthographic projection of the second opening portion 302 on the substrate 4 forms a part of a shadow region. It will be noted that a region corresponding to edges with uneven thickness of the pixel pattern constitute a shadow region (hereinafter referred to as a shadow). Therefore, the shadow region may also cover a portion of the orthographic projection of the second opening portion 302 on the substrate 4. A cross-sectional width W of the shadow is affected by the dimension of the second opening portion 302 along the depth direction of the opening 30 and the distance between the borders of the orthographic projections of the two surfaces of the second opening portion 302 proximate to and away from the first opening portion 301 on the substrate 4.

As shown in FIGS. 2, 3A and 3B, in the evaporation process, the evaporation material passes through the opening 30 of the mask 3 to form the pixel pattern in the pixel region 40 on the substrate 4. Since compared with the rounded corner geometric feature edge 30b, the dimension H1 of the linear geometric feature edge 30a of the second opening portion 302 along the depth direction of the opening 3 is relatively small, a tip C shown in FIG. 3A tends to be away from a center of the second opening portion 302. In this way, when the evaporation material is evaporated along an evaporation path with a small angle α shown in FIG. 3A (the angle of the evaporation path refers to an angle deviated from the vertical line from a center of the evaporation source EVA to the substrate 4), it may not be shielded by the tip C and may be evaporated onto the substrate 4. Therefore, the cross-sectional width W of the shadow corresponding to the linear geometric feature edge 30a is relatively small. Correspondingly, since the dimension H1 of the rounded corner geometric feature edge 30b of the second opening portion 302 along the depth direction of the opening is relatively large, the tip C shown in FIG. 3B tends to be closer to the center of the second opening portion 302. In this way, when the evaporation material is evaporated along an evaporation path with a larger angle (relative to the case of the linear geometric feature edge 30a), it may not be shielded by the tip C and may be evaporated onto the substrate. Therefore, the cross-sectional width W of the shadow corresponding to the rounded corner geometric feature edge 30b is relatively large.

For the distance between borders of the orthographic projections of the two surfaces of the second opening portion 302 proximate to and away from the first opening portion 301 on the substrate 4, as shown in FIG. 3A, the distance H2 between borders of the orthographic projections of the second opening portion 302 corresponding to the linear geometric feature edge 30a is relatively small. In this way, the region of the second opening portion 302 corresponding to the linear geometric feature edge 30a may allow the evaporation material to be evaporated on the substrate 4 in the evaporation path with a small angle α. Therefore, the cross-sectional width W of the shadow corresponding to the linear geometric feature edge 30a is relatively small. Correspondingly, as shown in FIG. 3B, the distance H4 between borders of the orthographic projections of the second opening portion 302 corresponding to the rounded corner geometric feature edge 30b is relatively large. In this way, the region of the second opening portion 302 corresponding to the rounded corner geometric feature edge 30b may allow the evaporation material to be evaporated on the substrate 4 in the evaporation path with a large angle (relative to the case of the linear geometric feature edge 30a). Therefore, the cross-sectional width W of the shadow corresponding to the rounded corner geometric feature edge 30b is relatively large.

In addition, as shown in FIGS. 3A, 3B and 12, for the square opening, the formed pixel pattern is a square pixel pattern. In this case, a distance between the linear geometric feature edge 30a of the pixel region 40 and the geometric center O' of the opening is relatively small, and a distance between the rounded corner geometric feature edge of the pixel region 40 and the geometric center O' of the opening is relatively large. Therefore, the rounded corner geometric feature edge 30b of the pixel region is easier to cause the color mixing compared with the linear geometric feature edge 30a of the pixel region.

As shown in FIG. 1, in a case where the actual position of the opening 30 of the mask 3 is inconsistent with a theoretical position determined based on the light-emitting region, the first jaw 11 and the second jaw 12 are used to adjust a pulling force applied to the mask 3. For example, the first jaw 11 and the second jaw 12 are used to firstly adjust the pulling force in the first direction X, and then adjust the pulling force in the second direction Y. Alternatively, the first jaw 11 and the second jaw 12 are used to firstly adjust the pulling force in the second direction Y, and then adjust the pulling force in the first direction X. It will be understood that a plane defined by the first direction X and the second direction Y is parallel to or coincides with the surface of the mask 3. In other words, an essence of using the first jaw 11 and the second jaw 12 to adjust the pulling force applied to the mask 3 is to separately adjust the pulling force in the first direction X and the pulling force in the second direction Y. However, as shown in FIGS. 3A, 3B and 12, since the cross-sectional widths W of the shadows corresponding to the linear geometric feature edge 30a and the rounded corner geometric feature edge 30b are different, the maximum offset values of the geometric center of the opening 30 allowed in a direction of the linear geometric feature edge 30a and in a direction of the rounded corner geometric feature edge 30b may be different.

Figure 13:
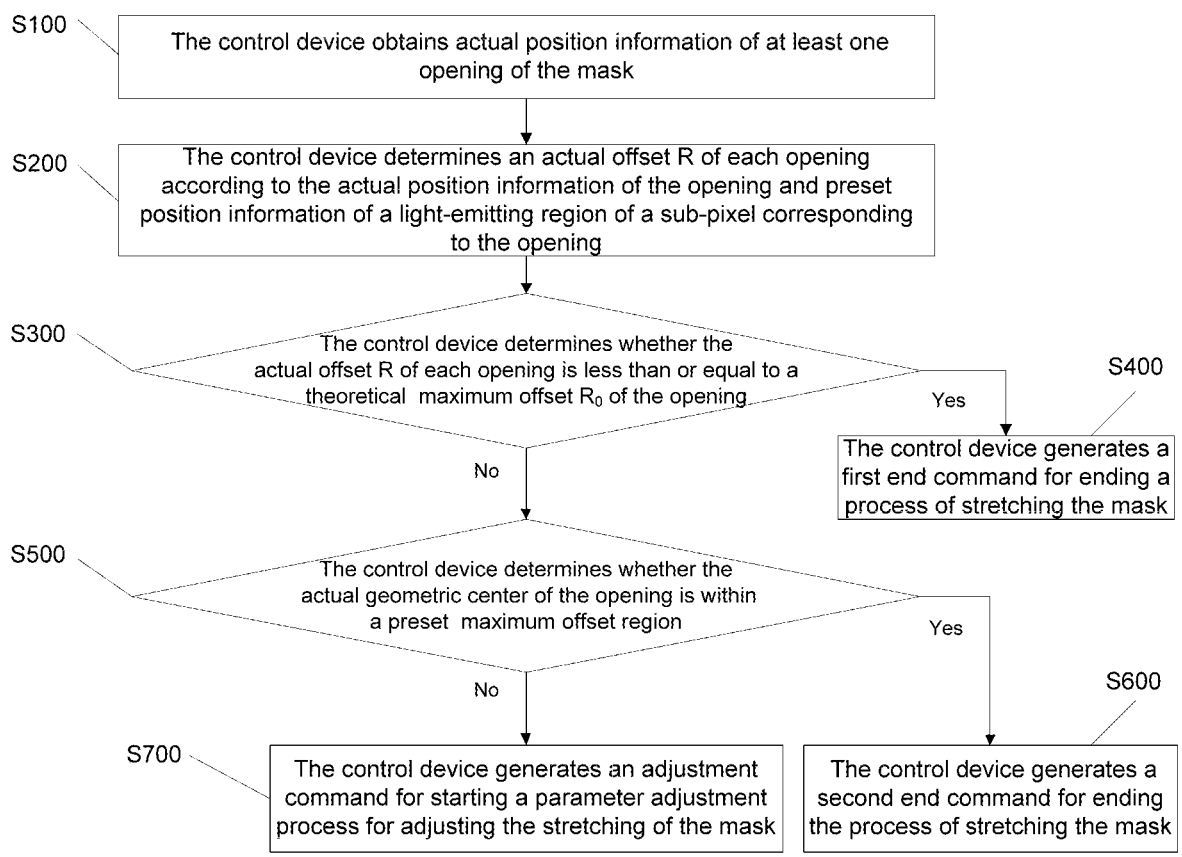
FIG. 13 is a flow chart of another method for controlling stretching of a mask, in accordance with some embodiments.

With regard to above situation, in some embodiments, as shown in FIG. 13, the method for controlling the stretching of the mask further includes S500 to S700.

In S500, in response to determining that the actual offset R of any opening 30 is greater than the theoretical maximum offset $R_0$ of the opening 30, the control device 500 determines whether the actual geometric center of the opening 30 is within a preset maximum offset region.

That is, if the actual offset R of any opening 30 is greater than the theoretical maximum offset $R_0$ of the opening 30, the control device 500 needs to make further determination. In addition, at least one opening 30, the actual offset R of which is greater than its theoretical maximum offset $R_0$, is the opening to be further determined.

Figure 14:
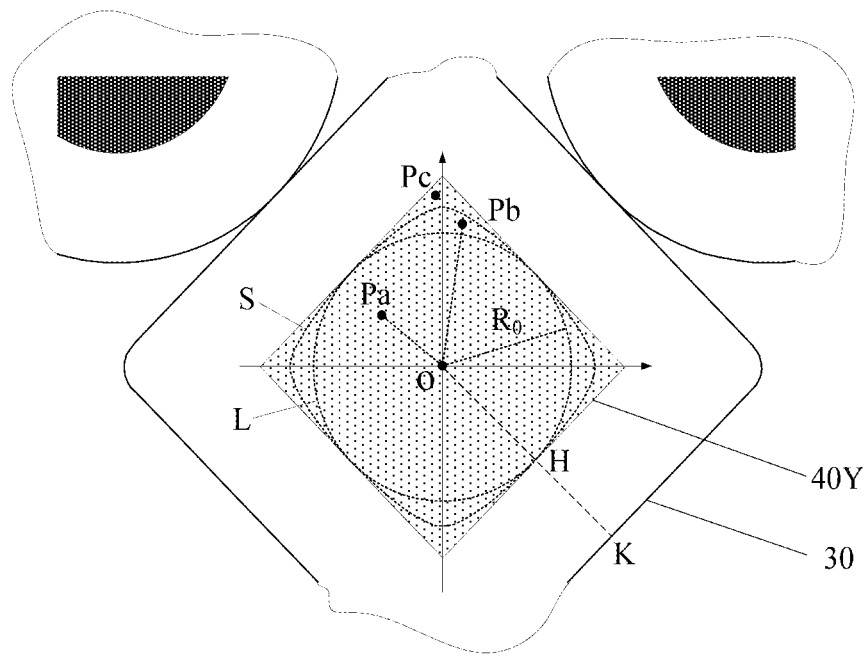
FIG. 14 is a schematic diagram of controlling stretching of a mask, in accordance with some embodiments.

The preset maximum offset region is a region that allows a maximum offset of the geometric center of the opening 30 without causing the color mixing or the color missing, with considering the shadow effect in the evaporation process. It will be understood that a range of the preset maximum offset region is greater than a range of the rounded region with the radius of the theoretical maximum offset $R_0$. For example, as shown in FIG. 14, the preset maximum offset region is the region S, and the rounded region formed by the theoretical maximum offset is the region L.

In S600, in response to determining that the actual geometric center of the opening 30 is within the preset maximum offset region, the control device 500 generates a second end command for ending the process of stretching the mask 3.

If the actual geometric center of the opening 30 is within the preset maximum offset region, it indicates that the current parameters for stretching the mask 3 are appropriate. In this way, the pixel pattern that is formed based on the opening 30 at the current position may completely cover the light-emitting region, and the problem of the color missing or the color mixing may not occur.

The second end command is used to instruct the stretcher 100 to end the process of stretching the mask 3. In response to receiving the second end command, the stretcher 100 ends the process of stretching the mask 3, and controls the first jaw 11 and the second jaw 12 to keep the mask 3 at the current position. Then, the welding gun is used to fix the mask 3 onto the frame 2.

It will be understood that both the first end command and the second end command are used to instruct the stretcher 100 to end the process of stretching the mask 3, but trigger conditions of the two are different.

In S700, in response to determining that the actual geometric center of the opening 30 is not within the preset maximum offset region, the control device 500 generates an adjustment command for starting a parameter adjustment process for adjusting the stretching of the mask 3.

It will be understood that if the actual geometric center of any opening 30 is not within the preset maximum offset region, the control device 500 will generate the adjustment command.

If the actual geometric center of the opening 30 is not within the preset maximum offset region, it indicates that the current parameters for stretching the mask 3 are inappropriate. In this way, the pixel pattern that is formed based on the opening 30 at the current position may not completely cover the light-emitting region, and the problem of the color missing and/or the color mixing may occur.

The adjustment command is used to instruct the stretcher 100 to start the parameter adjustment process for adjusting the stretching of the mask 3. In response to receiving the adjustment command, the stretcher 100 controls the first jaw 11 and the second jaw 12 to adjust the pulling force that is applied to the mask 3. The parameter for stretching the mask 3 includes a first pulling force in the first direction X and a second pulling force in the second direction Y.

It will be understood that the pulling force applied to the mask 3 may be determined according to the coordinates of the actual geometric center of the opening 30. For example, when the actual geometric center of the opening 30 shifts in the first direction X relative to the preset geometric center of the light-emitting region, a magnitude of the first pulling force applied to the mask 3 may be determined according to the offset of the actual geometric center in the first direction X. For another example, when the actual geometric center of the opening 30 shifts in the second direction Y relative to the preset geometric center of the light-emitting region, a magnitude of the second pulling force applied to the mask 3 may be determined according to the offset of the actual geometric center in the second direction Y.

It will be noted that after completing the parameter adjustment process, the control device 500 performs the above steps repeatedly, until the first end command or the second end command is generated.

In the method for controlling the stretching of the mask in some embodiments of the present disclosure, since the shadow effect is considered when the preset maximum offset region is determined, the position of opening 30 that meets the requirements (that is, without the color missing and the color mixing) may be determined accurately by using the preset maximum offset region.

The process for controlling the stretching of the mask 3 will be described in detail below with reference to FIG. 14. As shown in FIG. 14, it is assumed that a geometric center of a theoretical pixel region 40Y is O, the actual geometric center of a first shifted opening is Pa, and the actual geometric center of a second shifted opening is Pb.

For the actual geometric center Pa of the first shifted opening, the actual offset R (i.e., a length of OPa) of the opening is less than the theoretical maximum offset $R_0$ of the opening 30, which indicates that the pixel pattern formed based on the first shifted opening may not cause the problem of the color missing and the color mixing. That is, the magnitude of the pulling force applied to the mask 3 by the first jaw 11 and the second jaw 12 is appropriate.

For the actual geometric center Pb of the second shifted opening, the actual offset R (i.e., a length of OPb) of the opening is greater than the theoretical maximum offset $R_0$ of the opening 30, but the actual geometric center Pb of the opening is within the preset maximum offset region S, which indicates that the pixel pattern formed based on the second shifted opening may not cause the problem of the color missing and the color mixing as well. That is, the magnitude of the pulling force applied to the mask by the first jaw 11 and the second jaw 12 is appropriate.

It will be understood that, if the actual geometric center of the third shifted opening is Pc, the actual offset R (i.e., a length of OPc) of the opening is greater than the theoretical maximum offset $R_0$ of the opening 30, and the actual geometric center Pc of the opening is not within the preset maximum offset region S, it is indicated that the pixel pattern formed based on the third shifted opening may cause the problem of the color missing and the color mixing. Therefore, the pulling force applied to the mask by the first jaw 11 and the second jaw 12 will be adjusted again.

In some embodiments, as shown in FIGS. 3A, 3B and 14, when the pixel pattern is evaporated onto the substrate 4 by using the mask 3, a shape of the pixel pattern is substantially the same as a shape of the corresponding opening 30, and a geometric center of the pixel region 40 coincides with an orthographic projection of the geometric center of the corresponding opening 30 on the substrate 4. As shown in FIG. 14, taking a square light-emitting region 40Y as an example, both a shape of the opening 30 corresponding to the light-emitting region 40Y and a shape of the pixel pattern formed based on the opening 30 are square. The minimum distance between the side of the light-emitting region 40Y and a corresponding side of the opening 30 is indicated by a dotted line HK shown in FIG. 14, and the minimum distance of the preset geometric center O of the light-emitting region 40Y and the side of the light-emitting region 40Y is indicated by a dotted line OH shown in FIG. 14.

In some examples, the minimum distance OH is greater than or equal to the minimum distance HK. In some other examples, as shown in FIG. 14, the minimum distance HK is less than the minimum distance OH. Based on the two kinds of examples above, since the theoretical maximum offset $R_0$ of the opening is the minimum distance HK between the border of the light-emitting region and the border of the opening 30 (i.e., the side of the light-emitting region and the corresponding side of the opening in FIG. 14), the pixel pattern that is formed based on the opening 30 may neither exceed the theoretical pixel region, nor overlap with the adjacent pixel region in the case where the actual offset R of the opening 30 is less than or equal to the theoretical maximum offset $R_0$ of the opening 30. Therefore, the pixel pattern that is formed by using the mask 3 may not cause the problem of the color missing and the color mixing.

Figure 15:
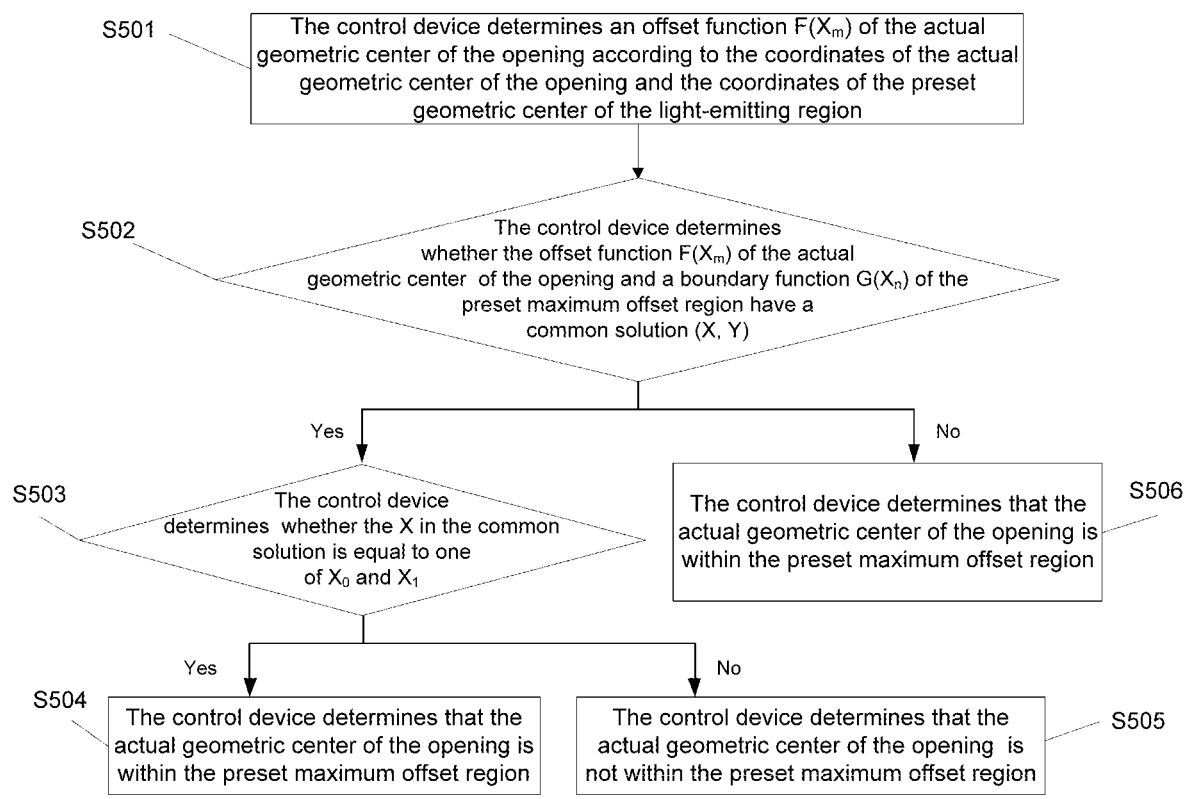
FIG. 15 is a flow chart of yet another method for controlling stretching of a mask, in accordance with some embodiments.

In some embodiments, the preset position information of the light-emitting region includes the coordinates of the preset geometric center of the light-emitting region. Based on this, as shown in FIG. 15, the S500 includes S501 to S506.

In S501, the control device 500 determines an offset function $F(X_m)$ of the actual geometric center of the opening 30 according to the coordinates of the actual geometric center of the opening 30 and the coordinates of the preset geometric center of the light-emitting region 40Y.

Where an absolute value of $X_m$ is greater than an absolute value of $X_0$, and is less than an absolute value of $X_1$, one of $X_0$ and $X_1$ is an abscissa of the preset geometric center of the light-emitting region, and another is an abscissa of the actual geometric center of the opening 30.

It can be seen that the offset function $F(X_m)$ of the actual geometric center of the opening 30 is essentially a line segment.

For example, the offset function $F(X_m)$ of the actual geometric center of the opening 30 is:

$$F(X_m) = \frac{Y_1 - Y_0}{X_1 - X_0} X_m + \left( Y_1 - \frac{Y_1 - Y_0}{X_1 - X_0} X_1 \right).$$

Where $X_m$ is an abscissa independent variable of the offset function of the actual geometric center of the opening 30, $X_0$ is the abscissa of the preset geometric center of the light-emitting region 40Y, $Y_0$ is an ordinate of the preset geometric center of the light-emitting region 40Y, $X_1$ is the abscissa of the actual geometric center of the opening 30, and $Y_1$ is the ordinate of the actual geometric center of the opening 30.

In S502, the control device 500 determines whether the offset function $F(X_m)$ of the actual geometric center of the opening 30 and a boundary function $G(X_n)$ of the preset maximum offset region have a common solution (X, Y).

For example, an expression of the boundary function $G(X_n)$ of the preset maximum offset region is:

$$G(X_n) = AX_n^2 + BX_n + C.$$

Where A is a first constant, B is a second constant, C is a third constant, $X_n$ is an abscissa independent variable of the boundary function of the preset maximum offset region.

It can be seen that the boundary function $G(X_n)$ of the preset maximum offset region is essentially a quadratic curve.

In S503, in response to determining that the offset function $F(X_m)$ and the boundary function $G(X_n)$ have the common solution (X, Y), the control device 500 determines whether the X in the common solution is equal to one of $X_0$ and $X_1$.

If the offset function $F(X_m)$ of the actual geometric center of the opening and the boundary function $G(X_n)$ of the preset maximum offset region have the common solution, it is indicated that the line segment used for characterizing an offset state of the actual geometric center of the opening and the quadratic curve used for characterizing the preset maximum offset region have an intersection point.

In S504, in response to determining that the X is equal to one of $X_0$ and $X_1$, the control device 500 determines that the actual geometric center of the opening 30 is within the preset maximum offset region.

It will be noted that, if the intersection point is exactly an endpoint of the line segment, it is considered that the actual geometric center of the opening 30 is within the preset maximum offset region.

In S505, in response to determining that the X is not equal to any one of $X_0$ and $X_1$, the control device 500 determines that the actual geometric center of the opening 30 is not within the preset maximum offset region.

If the intersection point is not the endpoint of the line segment but other point of the line segment, it is considered that the actual geometric center of the opening 30 is not within the preset maximum offset region.

In S506, in response to determining that the offset function $F(X_m)$ and the boundary function $G(X_n)$ do not have the common solution, the control device 500 determines that the actual geometric center of the opening 30 is within the preset maximum offset region.

If the offset function $F(X_m)$ of the actual geometric center of the opening 30 and the boundary function $G(X_n)$ of the preset maximum offset region do not have the common solution, it is indicated that the line segment used for characterizing the offset state of the actual geometric center of the opening 30 and the quadratic curve used for characterizing the preset maximum offset region do not have the intersection point. Therefore, it is considered that the actual geometric center of the opening 30 is within the preset maximum offset region.

For example, a curve of the boundary function of the preset maximum offset region is the approximately elliptical pattern shown in FIG. 14, i.e., the fitting pattern S of a trace that allows the maximum offset of the geometric center of the opening 30.

The following provides two methods for determining the boundary function $G(X_n)$ of the preset maximum offset region.

Figure 16:
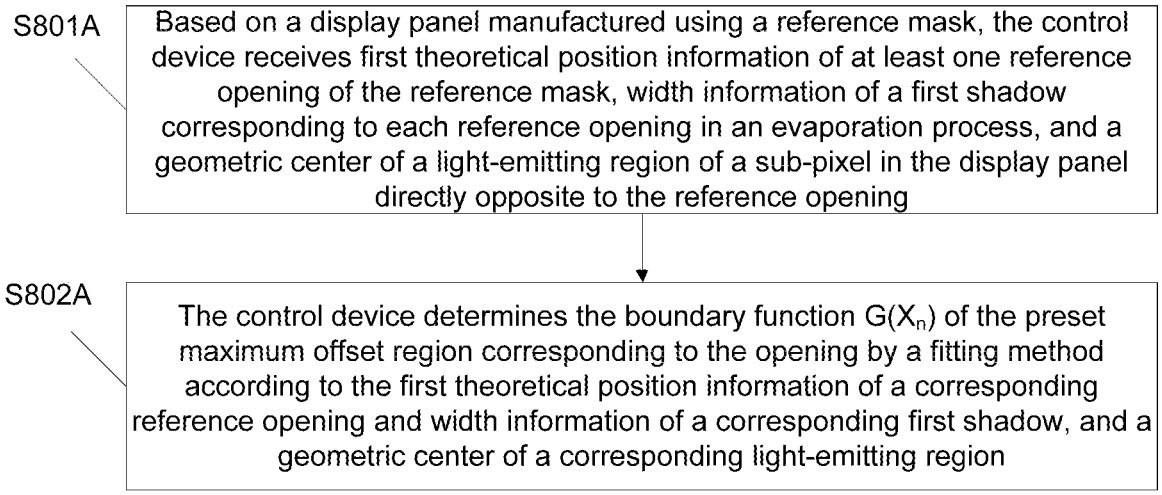
FIG. 16 is a flow chart of a method for determining a boundary function of a preset maximum offset region, in accordance with some embodiments.

In a first method, as shown in FIG. 16, before determining whether the actual geometric center of the opening 30 is within the preset maximum offset region, the method for controlling the stretching of the mask further includes S801A and S802A.

In S801A, based on a display panel manufactured using a reference mask, the control device 500 receives first theoretical position information of at least one reference opening of the reference mask, width information of a first shadow corresponding to each reference opening in an evaporation process, and a geometric center of a light-emitting region of a sub-pixel in the display panel directly opposite to the reference opening.

The reference mask refers to a mask that has a same specification as the mask used in the embodiments of the present disclosure. For example, the two are formed by a same mold. The first theoretical position information of the reference opening of the reference mask refers to information about the position of the reference opening designed based on the light-emitting region, which corresponds to position information of the light-emitting region of the sub-pixel in the display panel.

For example, the first theoretical position information of the reference opening of the reference mask and the geometric center of the light-emitting region of the sub-pixel in the display panel are pre-stored in a memory of the control device 500. The width information of the first shadow corresponding to the reference opening in the evaporation process may be obtained by detecting a film thickness near a pixel region of the display panel, so that a region corresponding to the film thickness that reaches 95% of a target thickness is the pixel region, and a region corresponding to the film thickness within 5%~95% of the target thickness is the shadow. In this way, the width information of the first shadow of the reference opening can be determined.

In S802A, the control device 500 determines the boundary function $G(X_n)$ of the preset maximum offset region corresponding to the opening by a fitting method according to the first theoretical position information of a corresponding reference opening and width information of a corresponding first shadow, and a geometric center of a corresponding light-emitting region.

For example, the pixel pattern to be formed may be determined according to the first theoretical position information of the reference opening and the corresponding width information of the first shadow. By controlling the pixel pattern to move near the geometric center of the light-emitting region, a trace of the geometric center of the pixel pattern free of the color missing and the color mixing may be determined. A function of the trace of the geometric center of the pixel pattern is the boundary function $G(X_n)$ of the preset maximum offset region corresponding to the opening.

Figure 17:
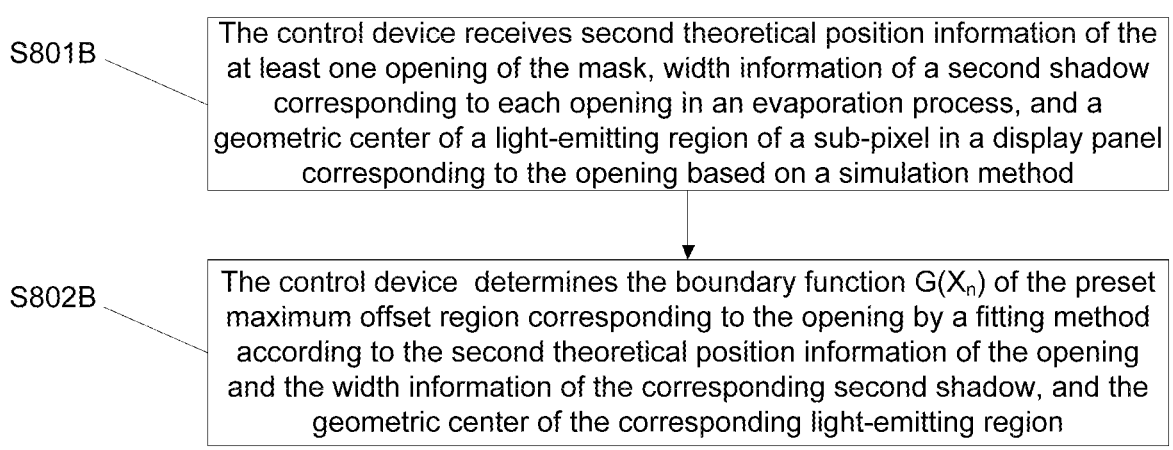
FIG. 17 is a flow chart of another method for determining a boundary function of a preset maximum offset region, in accordance with some embodiments.

In a second method, as shown in FIG. 17, before determining whether the actual geometric center of the opening 30 is within the preset maximum offset region, the method for controlling the stretching of the mask further includes S801B and S802B.

In S801B, the control device 500 receives second theoretical position information of the at least one opening 30 of the mask 3, width information of a second shadow corresponding to each opening 30 in an evaporation process, and a geometric center of a light-emitting region of a sub-pixel in a display panel corresponding to the opening 30 based on a simulation method.

For example, simulation parameters, such as evaporation source parameters used in the evaporation process, a theoretical position of the opening 30 of the mask 3, and a distance between the mask 3 and the substrate 4 are provided to a simulation software. In the case where the evaporation source is a point evaporation source, the evaporation source parameters include a position of a nozzle, a distance between the nozzle and the substrate 4, and a caliber of the nozzle. In the case where the evaporation source is a linear evaporation source, the evaporation source parameters include a position of a first nozzle and a position of a last nozzle, an interval between two adjacent nozzles, distances between each nozzle and the substrate 4, a caliber of each nozzle, and an angle of each nozzle. In this way, the simulation software may simulate the width information of the second shadow corresponding to the opening 30 in the evaporation process, according to the simulation parameters.

In S802B, the control device 500 determines the boundary function $G(X_n)$ of the preset maximum offset region corresponding to the opening by a fitting method according to the second theoretical position information of the opening and the width information of the corresponding second shadow, and the geometric center of the corresponding light-emitting region.

For example, the pixel pattern to be formed may be determined according to the second theoretical position information of the opening and the width information of the corresponding second shadow. By controlling the pixel pattern to move near the geometric center of the light-emitting region, a trace of the geometric center of the pixel pattern free of the color missing and the color mixing may be determined. A function of the trace of the geometric center of the pixel pattern is the boundary function $G(X_n)$ of the preset maximum offset region corresponding to the opening.

In some embodiments, the control device 500 is configured to perform the method for controlling the stretching of the mask. As shown in FIG. 10, the control device 500 includes a processor 520 and a memory 530 communicatively coupled to the processor 520.

The memory 530 is configured to store executable program codes. The executable program codes are used for implementing the method for controlling the stretching of the mask.

The processor 520 is configured to execute the program codes to: obtain actual position information of at least one opening 30 of the mask 3; determine an actual offset of each opening 30 according to the actual position information of the opening 30 and preset position information of a light-emitting region of a sub-pixel corresponding to the opening 30; determine whether the actual offset R of each opening 30 is less than or equal to a theoretical maximum offset $R_0$ of the opening 30; and in response to determining that the actual offset R of each opening 30 is less than or equal to the theoretical maximum offset $R_0$ of the opening 30, generate a first end command for ending a process of stretching the mask.

The processor 520 may be a single processor, or a collection of a plurality of processing elements. For example, the processor may be a central processing unit (CPU), an application specific integrated circuit (ASIC), or one or more integrated circuits for implementing the method for controlling the stretching of the mask, such as one or more digital signal processor (DSP), or one or more field programmable gate arrays (FPGA).

Beneficial effects and term meanings of the control device 500 in some embodiments of the present disclosure are same as beneficial effects and term meanings of the method for controlling the stretching of the mask, which will not be repeated herein.

In some embodiments, as shown in FIG. 10, the actual position information of the opening includes coordinates of an actual geometric center of the opening, and the preset position information of the light-emitting region includes coordinates of a preset geometric center of the light-emitting region. The processor 520 is further configured to execute the program codes to determine the actual offset of the opening according to the coordinates of the actual geometric center of the opening and the coordinates of the preset geometric center of the light-emitting region.

In some embodiments, as shown in FIG. 10, the actual position information of the opening includes coordinates of actual geometric center of the opening. The processor 520 is further configured to execute the program codes to: in response to determining that the actual offset of any opening is greater than the theoretical maximum offset of the opening, determine whether the actual geometric center of the opening is within a preset maximum offset region; in response to determining that the actual geometric center of the opening is within the preset maximum offset region, generate a second end command for ending the process of stretching the mask; and in response to determining that the actual geometric center of the opening is not within the preset maximum offset region, generate an adjustment command for starting a parameter adjustment process for adjusting the stretching of the mask.

In some embodiments, as shown in FIG. 10, the preset position information of the light-emitting region includes coordinates of a preset geometric center of the light-emitting region. The processor 520 is further configured to execute the program codes to: determine an offset function $F(X_m)$ of the actual geometric center of the opening according to the coordinates of the actual geometric center of the opening and the coordinates of the preset geometric center of the light-emitting region, wherein an absolute value of $X_m$ is greater than an absolute value of $X_0$, and is less than an absolute value of $X_1$, one of $X_0$ and $X_1$ is an abscissa of the preset geometric center of the light-emitting region, and another is an abscissa of the actual geometric center of the opening; determine whether the offset function $F(X_m)$ of the actual geometric center of the opening and a boundary function $G(X_n)$ of the preset maximum offset region have a common solution (X, Y); in response to determining that the offset function $F(X_m)$ and the boundary function $G(X_n)$ have the common solution (X, Y), determine whether the X in the common solution is equal to one of $X_0$ and $X_1$; in response to determining that the X in the common solution is equal to one of $X_0$ and $X_1$, determine that the actual geometric center of the opening is within the preset maximum offset region; in response to determining that the X in the common solution is not equal to one of $X_0$ and $X_1$, determine that the actual geometric center of the opening is not within the preset maximum offset region; and in response to determining that the offset function $F(X_m)$ and the boundary function $G(X_n)$ do not have the common solution, determine that the actual geometric center of the opening is within the preset maximum offset region.

In some embodiments, an expression of the offset function $F(X_m)$ of the actual geometric center of the opening is:

$$F(X_m) = \frac{Y_1 - Y_0}{X_1 - X_0} X_m + \left(Y_1 - \frac{Y_1 - Y_0}{X_1 - X_0} X_1\right).$$

Where $X_m$ is an abscissa independent variable of the offset function of the actual geometric center of the opening, $X_0$ is the abscissa of the preset geometric center of the light-emitting region, $Y_0$ is an ordinate of the preset geometric center of the light-emitting region, $X_1$ is the abscissa of the actual geometric center of the opening, and $Y_1$ is an ordinate of the actual geometric center of the opening;

In some embodiments, an expression of the boundary function $G(X_n)$ of the preset maximum offset region is:

$$G(X_n) = AX_n^2 + BX_n + C.$$

Where A is a first constant, B is a second constant, C is a third constant, $X_n$ is an abscissa independent variable of the boundary function of the preset maximum offset region.

Figure 18:
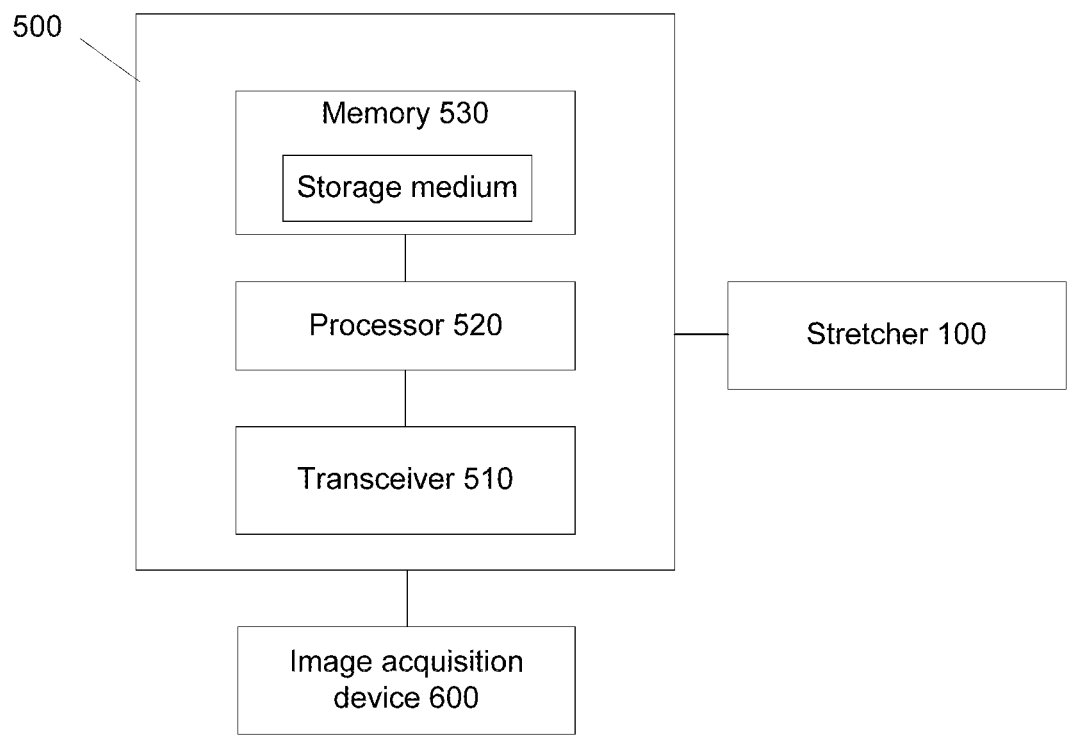
FIG. 18 is a block diagram of another stretching system, in accordance with some embodiments.

In some embodiments, as shown in FIG. 18, the control device 500 further includes a transceiver 510 communicatively coupled to the processor 520. The transceiver 510 is configured to receive first theoretical position information of at least one reference opening of a reference mask, width information of a first shadow corresponding to each reference opening in an evaporation process, and a geometric center of a light-emitting region of a sub-pixel in a display panel directly opposite to the reference opening based on the display panel manufactured using the reference mask. The reference mask and the mask have a same specification. The processor 520 is further configured to execute the program codes to determine the boundary function $G(X_n)$ of the preset maximum offset region corresponding to the opening by a fitting method according to the first theoretical position information of a corresponding reference opening, width information of a corresponding first shadow, and a geometric center of a corresponding light-emitting region.

It will be understood that the transceiver 510 may be communicatively coupled to the image acquiring device 600 or an image storage device, so as to receive or retrieve an image of the opening 30 of the mask 3. For example, the transceiver 510 may be implemented by an integrated circuit (i.e., a transceiver circuit).

In some other embodiments, as shown in FIG. 18, the control device 500 further includes a transceiver 510 communicatively coupled to the processor 520. The transceiver 510 is configured to receive second theoretical position information of the at least one opening of the mask, width information of a second shadow corresponding to each opening in an evaporation process, and a geometric center of a light-emitting region of a sub-pixel in a display panel corresponding to the opening based on a simulation method. The processor 520 is further configured to execute the program codes to determine the boundary function $G(X_n)$ of the preset maximum offset region corresponding to the opening by a fitting method according to the first theoretical position information of the opening, width information of the corresponding second shadow, and the geometric center of the corresponding light-emitting region.

In some embodiments, as shown in FIG. 18, the memory 530 is further configured to store the preset position information of the light-emitting region, the actual position information of the opening, and the first theoretical location information of the reference opening or the second theoretical position information of the opening.

For example, the memory 530 may be a single memory, or a collection name of a plurality of storage elements. The memory 530 includes a random access memory (RAM), a non-volatile memory such as a disk memory, or a flash memory.

As shown in FIGS. 10 and 18, some embodiments of the present disclosure provide a non-transitory computer-readable storage medium storing one or more program instructions that, when executed by one or more processor 520 of the control device 500, cause the one or more processors 520 to perform one or more steps of the method for controlling the stretching of the mask.

The program instructions may be transmitted from a website site, computer, server or data center to another website site, computer, server, or data center by means of wire (e.g., a coaxial cable, a fiber optic, a digital subscriber line (DSL)), or wireless (e.g., infrared, wireless, microwave). The computer-readable storage medium may be any available medium that can be stored in a computer, or a data storage device such as a server or a data center integrated with one or more available mediums. The available medium may be a magnetic medium (e.g., a floppy disk, a hard disk, a magnetic tape), an optical medium (e.g., a DVD), or a semiconductor medium (e.g., a solid state disk (SSD)), or the like.

In some embodiments, as shown in FIG. 10, the stretching system includes the control device 500.

Beneficial effects of the stretching system in some embodiments of the present disclosure are same as beneficial effects of the control method for stretching a mask, which will not be repeated herein.

It will be understood that, as shown in FIG. 10, the stretching system further includes the stretcher 100. The transceiver 510 included in the control device 500 is communicatively coupled to the stretcher 100.

Figure 19:
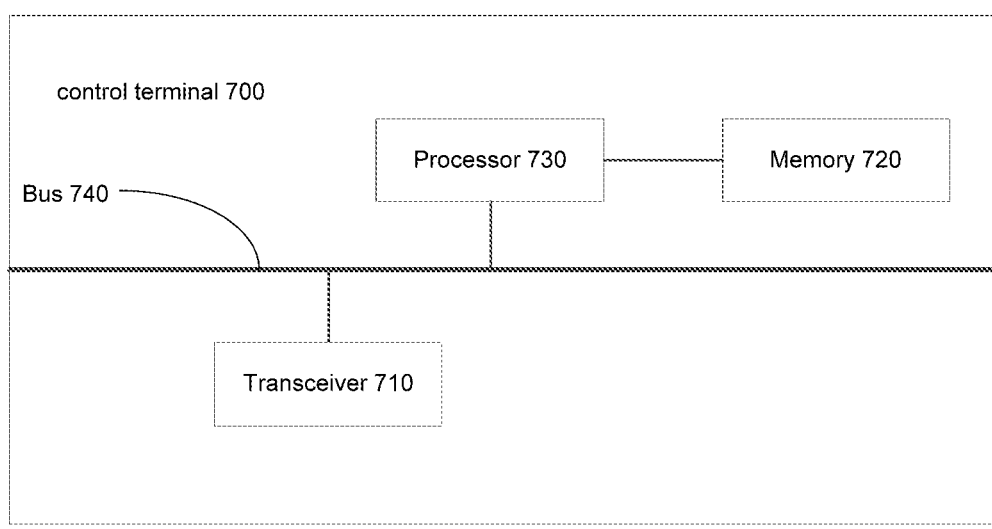
FIG. 19 is a block diagram of a terminal for controlling stretching of a mask, in accordance with some embodiments.

As shown in FIG. 19, some embodiments of the present disclosure provide a control terminal 700 for controlling the stretching of the mask. The control terminal 700 includes a processor 730, a memory 720, a transceiver 710, and a bus 740. The processor 730, the memory 720, and the transceiver 710 are capable of being in communication with each other through the bus 740. The memory 720 is configured to store computer program instructions, and the processor 730 is configured to execute the computer program instructions to perform the method for controlling the stretching of the mask.

The processor 730 may be a single processor, or a collection of a plurality of processing elements. For example, the processor 730 may be a central processing unit (CPU), an application specific integrated circuit (ASIC), or one or more integrated circuits for implementing the control method for stretching a mask, such as one or more digital signal processor (DSP), or one or more field programmable gate arrays (FPGA).

The memory 720 may be a single memory, or a collection of a plurality of storage elements. The memory 720 is used to store executable program codes. The memory 720 may be a random access memory (RAM), a non-volatile memory such as a disk memory, or a flash memory.

The bus 740 may be an industry standard architecture (ISA) bus, a peripheral component interconnect (PCI) bus, or an extended industry standard architecture (EISA) bus, or the like. The bus 740 may be divided into an address bus, a data bus, and a control bus, etc. For ease of representation, only a thick line is used in FIG. 19, but it does not mean that there is only one bus or one type of bus.

Various embodiments in the present specification are described in a progressive manner. As for the same or similar parts between the various embodiments, reference may be made to each other. Each embodiment focuses on differences between the embodiment and other embodiments. In particular, for embodiments of devices, since they are substantially similar to embodiments of methods, descriptions thereof are relatively simple. For relevant information, reference may be made to parts of description in the embodiments of methods.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A stretching system, comprising a device for controlling a stretcher for stretching of a mask, and the stretcher; wherein the mask includes at least one patterned region, each of the at least one patterned region have a plurality of openings, and the device comprises:
    a memory configured to store executable program codes;
    a transceiver communicatively coupled to the stretcher; and
    a processor communicatively coupled to the memory and the transceiver, and the processor is configured to execute the executable program codes to:
    obtain actual position information of at least one opening of the mask;
    determine an actual offset of each of the at least one opening according to actual position information of the each opening and preset position information of a light-emitting region of a sub-pixel corresponding to the each opening;
    determine whether the actual offset of the each opening is less than or equal to a theoretical maximum offset of the each opening, wherein the theoretical maximum offset of the each opening is a minimum distance from a border of the light-emitting region to a border of the each opening in a case where a geometric center of the light-emitting region coincides with a geometric center of the each opening; and
    in response to determining that the actual offset of the each opening is less than or equal to the theoretical maximum offset of the each opening, generate a first end command for ending a process of stretching the mask; wherein the transceiver is configured to send the first end command to the stretcher, so that the stretcher ends the process of stretching the mask; and
    the processor is further configured to execute the executable program codes to:

in response to determining that the actual offset of any one of the at least one opening is greater than a theoretical maximum offset of the one of the at least one opening, determine whether an actual geometric center of the one of the at least one opening is within a preset maximum offset region, wherein the preset maximum offset region is a region that allows a maximum offset of the actual geometric center of the one of the at least one opening;

in response to determining that the actual geometric center of the one of the at least one opening is within the preset maximum offset region, generate a second end command for ending the process of stretching the mask; wherein the transceiver is further configured to send the second end command to the stretcher, so that the stretcher ends the process of stretching the mask; and in response to determining that the actual geometric center of the one of the at least one opening is not within the preset maximum offset region, generate an adjustment command for starting a parameter adjustment process for adjusting the stretching of the mask; wherein the transceiver is further configured to send the adjustment command to the stretcher, so that the stretcher starts the parameter adjustment process for adjusting the stretching of the mask; wherein the actual position information of the each opening includes coordinates of an actual geometric center of the each opening, and the preset position information of the light-emitting region includes coordinates of a preset geometric center of the light-emitting region; and the processor is further configured to execute the executable program codes to determine the actual offset of the each opening according to the coordinates of the actual geometric center of the each opening and the coordinates of the preset geometric center of the light-emitting region.

2. The stretching system according to claim 1, wherein the processor is further configured to execute the executable program codes to:

determine an offset function $F(X_m)$ of the actual geometric center of the one of the at least one opening according to coordinates of the actual geometric center of the one of the at least one opening and coordinates of a preset geometric center of a corresponding light-emitting region, wherein an absolute value of $X_m$ is greater than an absolute value of $X_0$, and is less than an absolute value of $X_1$, one of $X_0$ and $X_1$ is an abscissa of the preset geometric center of the corresponding light-emitting region, and another is an abscissa of the actual geometric center of the one of the at least one opening;

determine whether the offset function $F(X_m)$ of the actual geometric center of the one of the at least one opening and a boundary function $G(X_n)$ of the preset maximum offset region have a common solution (X, Y);

in response to determining that the offset function $F(X_m)$ and the boundary function $G(X_n)$ have the common solution (X, Y), determine whether the X in the common solution is equal to one of $X_0$ and $X_1$:

in response to determining that the X in the common solution is equal to one of $X_0$ and $X_1$, determine that the actual geometric center of the one of the at least one opening is within the preset maximum offset region; and in response to determining that the X in the common solution is not equal to one of $X_0$ and $X_1$, determine that the actual geometric center of the one of the at least one opening is not within the preset maximum offset region; and in response to determining that the offset function $F(X_m)$ and the boundary function $G(X_n)$ do not have the common solution, determine that the actual geometric center of the one of the at least one opening is within the preset maximum offset region.

3. The stretching system according to claim 2, wherein an expression of the offset function $F(X_m)$ of the actual geometric center of the one of the at least one opening is:

$$F(X_m) = \frac{Y_1 - Y_0}{X_1 - X_0} X_m + \left(Y_1 - \frac{Y_1 - Y_0}{X_1 - X_0} X_1\right),$$

wherein $X_m$ is an abscissa independent variable of the offset function of the actual geometric center of the one of the at least one opening, $X_0$ is the abscissa of the preset geometric center of the corresponding light-emitting region, $Y_0$ is an ordinate of the preset geometric center of the corresponding light-emitting region, $X_1$ is the abscissa of the actual geometric center of the one of the at least one opening, and $Y_1$ is an ordinate of the actual geometric center of the one of the at least one opening; and an expression of the boundary function $G(X_n)$ of the preset maximum offset region is:

$G(X_n) = AX_n^2 + BX_n + C,$ wherein A is a first constant, B is a second constant, C is a third constant, $X_n$ is an abscissa independent variable of the boundary function of the preset maximum offset region.

4. The stretching system according to claim 1, wherein the transceiver is further configured to receive first theoretical position information of at least one reference opening of a reference mask, width information of a first shadow corresponding to each of the at least one opening, and a geometric center of a light-emitting region of a sub-pixel in a display panel directly opposite to the reference opening based on the display panel manufactured using the reference mask, the reference mask and the mask having a same specification; and the processor is further configured to execute the executable program codes to determine a boundary function $G(X_n)$ of the preset maximum offset region corresponding to the each opening by a fitting method according to first theoretical position information of a corresponding reference opening, width information of a corresponding first shadow, and a geometric center of a corresponding light-emitting region.

5. The stretching system according to claim 4, wherein the memory is further configured to store the preset position information of the light-emitting region, the actual position information of the each opening, and the first theoretical position information of the reference opening.

6. The stretching system according to claim 1, wherein the transceiver is further configured to receive second theoretical position information of the at least one opening of the mask, width information of a second shadow corresponding to each of the at least one opening, and a geometric center of a light-emitting region of a sub-pixel in a display panel corresponding to the each opening based on a simulation method;

the processor is further configured to execute the executable program codes to determine a boundary function $G(X_n)$ of the preset maximum offset region corresponding to the each opening by a fitting method according to second theoretical position information of the each opening, width information of a corresponding second shadow, and a geometric center of a corresponding light-emitting region.

7. A method for controlling stretching of a mask, the method is performed by a device for controlling a stretcher for the stretching of the mask, the device and the stretcher being included in a stretching system, and the device comprising:

a memory configured to store executable program codes;

a transceiver communicatively coupled to the stretcher, wherein the transceiver is configured to send a first end command or a second end command to the stretcher, so that the stretcher ends the process of stretching the mask; the transceiver is further configured to send an adjustment command to the stretcher, so that the stretcher starts the parameter adjustment process for adjusting the stretching of the mask; and a processor communicatively coupled to the memory and the transceiver, and the processor is configured to execute the executable program codes to perform the method;

the method comprising:

obtaining, by the processor, actual position information of at least one opening of the mask;

determining, by the processor, an actual offset of each of the at least one opening according to actual position information of the each opening and preset position information of a light-emitting region of a sub-pixel corresponding to the each opening;

determining, by the processor, whether the actual offset of the each opening is less than or equal to a theoretical maximum offset of the each opening, the theoretical maximum offset of the each opening being a minimum distance from a border of the light-emitting region to a border of the each opening in a case where a geometric center of the light-emitting region coincides with a geometric center of the each opening;

in response to determining that the actual offset of the each opening is less than or equal to the theoretical maximum offset of the each opening, generating, by the processor, the first end command;

sending, by the transceiver, the first end command to the stretcher; wherein the actual position information of the each opening includes coordinates of an actual geometric center of the each opening, and the preset position information of the light-emitting region includes coordinates of a preset geometric center of the light-emitting region; and the method further comprises:

determining, by the processor, the actual offset of the each opening according to the actual position information of the each opening and the preset position information of the light-emitting region of the sub-pixel corresponding to the each opening, comprises:

determining, by the processor, the actual offset of the each opening according to the coordinates of the actual geometric center of the each opening and the coordinates of the preset geometric center of the light-emitting region;

in response to determining that the actual offset of any one of the at least one opening is greater than a theoretical maximum offset of the one of the at least one opening, determining, by the processor, whether an actual geometric center of the one of the at least one opening is within a preset maximum offset region, the preset maximum offset region being a region that allows a maximum offset of the actual geometric center of the one of the at least one opening;

in response to determining that the actual geometric center of the one of the at least one opening is within the preset maximum offset region, generating, by the processor, the second end command;

sending, by the transceiver, the second end command to the stretcher;

in response to determining that the actual geometric center of the one of the at least one opening is not within the preset maximum offset region, generating, by the processor, the adjustment command; and sending, by the transceiver, the adjustment command to the stretcher.

8. The method according to claim 7, wherein determining, by the processor, whether the actual geometric center of the one of the at least one opening is within the preset maximum offset region, comprises:

determining, by the processor, an offset function $F(X_m)$ of the actual geometric center of the one of the at least one opening according to coordinates of the actual geometric center of the one of the at least one opening and coordinates of a preset geometric center of a corresponding light-emitting region, wherein an absolute value of $X_m$ is greater than an absolute value of $X_0$, and is less than an absolute value of $X_1$, one of $X_0$ and $X_1$ is an abscissa of the preset geometric center of the corresponding light-emitting region, and another is an abscissa of the actual geometric center of the one of the at least one opening;

determining, by the processor, whether the offset function $F(X_m)$ of the actual geometric center of the one of the at least one opening and a boundary function $G(X_n)$ of the preset maximum offset region have a common solution $(X, Y)$;

in response to determining that the offset function $F(X_m)$ and the boundary function $G(X_n)$ have the common solution $(X, Y)$, determining, by the processor, whether the $X$ in the common solution is equal to one of $X_0$ and $X_1$;

in response to determining that the $X$ in the common solution is equal to one of $X_0$ and $X_1$, determining, by the processor, that the actual geometric center of the one of the at least one opening is within the preset maximum offset region; and in response to determining that the $X$ in the common solution is not equal to one of $X_0$ and $X_1$, determining, by the processor, that the actual geometric center of the one of the at least one opening is not within the preset maximum offset region; and in response to determining that the offset function $F(X_m)$ and the boundary function $G(X_n)$ do not have the common solution, determining, by the processor, that the actual geometric center of the one of the at least one opening is within the preset maximum offset region.

9. The method according to claim 8, wherein an expression of the offset function $F(X_m)$ of the actual geometric center of the one of the at least one opening is:

$$F(X_m) = \frac{Y_1 - Y_0}{X_1 - X_0} X_m + \left( Y_1 - \frac{Y_1 - Y_0}{X_1 - X_0} X_1 \right),$$

wherein $X_m$ is an abscissa independent variable of the offset function of the actual geometric center of the one of the at least one opening, $X_0$ is the abscissa of the preset geometric center of the corresponding light-emitting region, $Y_0$ is an ordinate of the preset geometric center of the corresponding light-emitting region, $X_1$ is the abscissa of the actual geometric center of the one of the at least one opening, and $Y_1$ is an ordinate of the actual geometric center of the one of the at least one opening;

an expression of the boundary function $G(X_n)$ of the preset maximum offset region is:

$$G(X_n)=AX_n^2+BX_n+C,$$

wherein A is a first constant, B is a second constant, C is a third constant, $X_n$ is an abscissa independent variable of the boundary function of the preset maximum offset region.

10. The method according to claim 7, wherein before determining, by the processor, whether the actual geometric center of the one of the at least one opening is within the preset maximum offset region, the method further comprises:

receiving, by the transceiver, first theoretical position information of at least one reference opening of a reference mask, width information of a first shadow corresponding to each reference opening, and a geometric center of a light-emitting region of a sub-pixel in a display panel directly opposite to the reference opening based on the display panel manufactured using the reference mask, the reference mask and the mask having a same specification; and determining, by the processor, a boundary function $G(X_n)$ of the preset maximum offset region corresponding to the each opening by a fitting method according to first theoretical position information of a corresponding reference opening, width information of a corresponding first shadow, and a geometric center of a corresponding light-emitting region.

11. The method according to claim 7, wherein before determining, by the processor, whether the actual geometric center of the one of the at least one opening is within the preset maximum offset region, the method further comprises:

receiving, by the transceiver, second theoretical position information of the at least one opening of the mask, width information of a second shadow corresponding to each of the at least one opening, and a geometric center of a light-emitting region of a sub-pixel in a display panel corresponding to the each opening based on a simulation method; and determining, by the processor, a boundary function $G(X_n)$ of the preset maximum offset region corresponding to the each opening by a fitting method according to second theoretical position information of the each opening, width information of a corresponding second shadow, and a geometric center of a corresponding light-emitting region.

12. A non-transitory computer-readable storage medium storing one or more program instructions that, when are executed by one or more processors of a control device, cause the one or more processors to perform a method for controlling stretching of a mask, the method is performed by a device for controlling a stretcher for the stretching of the mask, and the device comprising:

a memory configured to store executable program codes;

a transceiver communicatively coupled to the stretcher, wherein the transceiver is configured to send a first end command or a second end command to the stretcher, so that the stretcher ends the process of stretching the mask; the transceiver is further configured to send an adjustment command to the stretcher, so that the stretcher starts the parameter adjustment process for adjusting the stretching of the mask; and a processor communicatively coupled to the memory and the transceiver, and the processor is configured to execute the executable program codes to perform the method;

the method comprising:

obtaining, by the processor, actual position information of at least one opening of the mask;

determining, by the processor, an actual offset of each of the at least one opening according to actual position information of the each opening and preset position information of a light-emitting region of a sub-pixel corresponding to the each opening;

determining, by the processor, whether the actual offset of the each opening is less than or equal to a theoretical maximum offset of the each opening, the theoretical maximum offset of the each opening being a minimum distance from a border of the light-emitting region to a border of the each opening in a case where a geometric center of the light-emitting region coincides with a geometric center of the each opening;

in response to determining that the actual offset of the each opening is less than or equal to the theoretical maximum offset of the each opening, generating, by the processor, the first end command;

sending, by the transceiver, the first end command to the stretcher; wherein the actual position information of the each opening includes coordinates of an actual geometric center of the each opening, and the preset position information of the light-emitting region includes coordinates of a preset geometric center of the light-emitting region; and the method further comprises:

determining, by the processor, the actual offset of the each opening according to the actual position information of the each opening and the preset position information of the light-emitting region of the sub-pixel corresponding to the each opening, comprises:

determining, by the processor, the actual offset of the each opening according to the coordinates of the actual geometric center of the each opening and the coordinates of the preset geometric center of the light-emitting region;

in response to determining that the actual offset of any one of the at least one opening is greater than a theoretical maximum offset of the one of the at least one opening, determining, by the processor, whether an actual geometric center of the one of the at least one opening is within a preset maximum offset region, the preset maximum offset region being a region that allows a maximum offset of the actual geometric center of the one of the at least one opening;

in response to determining that the actual geometric center of the one of the at least one opening is within the preset maximum offset region, generating, by the processor, the second end command;

sending, by the transceiver, the second end command to the stretcher;

in response to determining that the actual geometric center of the one of the at least one opening is not within the preset maximum offset region, generating, by the processor, the adjustment command; and sending, by the transceiver, the adjustment command to the stretcher.

\* \* \* \* \*